United States Patent
Li et al.

(10) Patent No.: US 10,530,356 B2
(45) Date of Patent: Jan. 7, 2020

(54) OVERCURRENT DETECTION CIRCUIT AND METHOD, LOAD SWITCH, AND PORTABLE DEVICE

(71) Applicant: FAIRCHILD SEMICONDUCTOR CORPORATION, San Jose, CA (US)

(72) Inventors: Maoxu Li, Shanghai (CN); Shide Zheng, Shanghai (CN)

(73) Assignee: FAIRCHILD SEMICONDUCTOR CORPORATION, Phoenix, AZ (US)

( * ) Notice: Subject to any disclaimer, the term of this patent is extended or adjusted under 35 U.S.C. 154(b) by 737 days.

(21) Appl. No.: 14/632,764

(22) Filed: Feb. 26, 2015

(65) Prior Publication Data

US 2015/0244164 A1 Aug. 27, 2015

(30) Foreign Application Priority Data

Feb. 27, 2014 (CN) .......................... 2014 1 0075056

(51) Int. Cl.
*H02H 3/00* (2006.01)
*H03K 17/082* (2006.01)

(52) U.S. Cl.
CPC ................ *H03K 17/0822* (2013.01)

(58) Field of Classification Search
CPC ...... H03K 17/0822; H02H 3/26; H02H 1/003; H02H 11/00
USPC .......................................................... 361/87
See application file for complete search history.

(56) References Cited

U.S. PATENT DOCUMENTS

| 5,978,195 A * | 11/1999 | Goder ................. H02H 7/1227 361/71 |
| 6,014,030 A * | 1/2000 | Smith .............. G01R 19/16542 320/128 |
| 6,225,797 B1 * | 5/2001 | Willis ..................... G05F 1/573 323/351 |
| 7,468,877 B2 * | 12/2008 | Oki ......................... G05F 1/573 361/91.3 |
| 8,310,222 B2 | 11/2012 | Tichy |
| 2007/0223164 A1 | 9/2007 | Oki et al. |
| 2007/0253129 A1 * | 11/2007 | Yoshikawa ........... H02P 25/034 361/93.1 |
| 2011/0248696 A1 * | 10/2011 | Tichy ................. H02M 3/1588 323/288 |
| 2012/0134707 A1 | 5/2012 | Inukai |

FOREIGN PATENT DOCUMENTS

CN 102570824 A 7/2012

* cited by examiner

*Primary Examiner* — Thienvu V Tran
*Assistant Examiner* — Lucy M Thomas
(74) *Attorney, Agent, or Firm* — Dickinson Wright PLLC

(57) ABSTRACT

The present invention provides an overcurrent detection circuit, an overcurrent detection method, a load circuit, and a portable device. The overcurrent detection circuit comprises: a first overcurrent detection sub-circuit and a second overcurrent detection sub-circuit; wherein: the first overcurrent detection sub-circuit is configured to perform overcurrent detection for a switch circuit when a voltage of an output terminal of the switch circuit is greater than or equal to a preset threshold; and the second overcurrent detection sub-circuit is configured to perform overcurrent detection for the switch circuit when the voltage of the output terminal of the switch circuit is less than the preset threshold.

19 Claims, 5 Drawing Sheets

OVERCURRENT DETECTION CIRCUIT AND METHOD, LOAD SWITCH, AND PORTABLE DEVICE

CROSS-REFERENCE TO RELATED APPLICATION

This application claims priority to and the benefit of Chinese Patent Application No. 201410075056.3 filed in the State Intellectual Property Office of China on Feb. 27, 2014, the entire contents of which are incorporated herein by reference.

TECHNICAL FIELD

The present invention relates to the overcurrent technologies, and in particular, relates to an overcurrent detection circuit, an overcurrent detection method, a load switch, and a portable device.

BACKGROUND ART

In recent years with the development of portable devices, in order to save electric energy, in addition to a high efficiency power management integrated circuit (IC) a plurality of load switches are needed to realize the objective of supplying power to a load used by a user among the load switches and of cutting off power supply to the unused loads.

A load switch is a power supply channel component, located between a power supply and a load, which uses logic levels to control ON or OFF states, causing a load to be powered or not powered. To improve the working reliability of a traditional load switch, people have designed functions to load switches, such as the reverse current blocking (RCB) function, and correspondingly a load switch having the RCB function may be referred to as an RCB load switch.

During use, a traditional RCB load switch may be subjected to an overcurrent which flows through a power N-channel metal-oxide-semiconductor field-effect transistor (NMOSFET). Therefore, to prevent such problem, the RCB load switch is typically provided with an overcurrent protection circuit, to protect the power NMOSFET and the load.

SUMMARY OF INVENTION

To solve the present technical problem, embodiments of the present invention provide an overcurrent detection circuit, an overcurrent detection method, a load circuit, and a portable device.

An embodiment of the present invention provides an overcurrent detection circuit, comprising: a first overcurrent detection sub-circuit and a second overcurrent detection sub-circuit; wherein:

the first overcurrent detection sub-circuit is configured to perform overcurrent detection for a switch circuit when a voltage of an output terminal of the switch circuit is greater than or equal to a preset threshold; and the second overcurrent detection sub-circuit is configured to perform overcurrent detection for the switch circuit when the voltage of the output terminal of the switch circuit is less than the preset threshold.

An embodiment of the present invention further provides an overcurrent detection method, comprising:

performing, by a first overcurrent detection sub-circuit of an overcurrent detection circuit, overcurrent detection for a switch circuit when a voltage of an output terminal of the switch circuit is greater than or equal to a preset threshold; and performing, by a second overcurrent detection sub-circuit of the overcurrent detection circuit, overcurrent detection for the switch circuit when the voltage of the output terminal of the switch circuit is less than the preset threshold.

An embodiment of the present invention further provides a load circuit, the load circuit comprising an overcurrent detection circuit, wherein the overcurrent detection circuit comprises: a first overcurrent detection sub-circuit and a second overcurrent detection sub-circuit; wherein:

the first overcurrent detection sub-circuit is configured to perform overcurrent detection for a switch circuit when a voltage of an output terminal of the switch circuit is greater than or equal to a preset threshold; and the second overcurrent detection sub-circuit is configured to perform overcurrent detection for the switch circuit when the voltage of the output terminal of the switch circuit is less than the preset threshold.

An embodiment of the present invention further provides a portable device, comprising a load circuit, the load circuit comprising an overcurrent detection circuit, wherein the overcurrent detection circuit comprises: a first overcurrent detection sub-circuit and a second overcurrent detection sub-circuit; wherein:

the first overcurrent detection sub-circuit is configured to perform overcurrent detection for a switch circuit when a voltage of an output terminal of the switch circuit is greater than or equal to a preset threshold; and the second overcurrent detection sub-circuit is configured to perform overcurrent detection for the switch circuit when the voltage of the output terminal of the switch circuit is less than the preset threshold.

According to the overcurrent detection circuit, the overcurrent detection method, the load switch, and the portable device provided in the embodiments of the present invention, a first overcurrent detection sub-circuit performs overcurrent detection for a switch circuit when a voltage of an output terminal of the switch circuit is greater than or equal to a preset threshold; and a second overcurrent detection sub-circuit performs overcurrent detection for the switch circuit when the voltage of the output terminal of the switch circuit less than the preset threshold. As such, overcurrents present during the process from start-up of power-on to normal power-on and working may be effectively detected.

BRIEF DESCRIPTION OF THE DRAWINGS

In the attached drawings (which are not necessarily drawn according to the practical proportion), like reference signs may be used to denote like parts or elements in different drawings. Reference signs having different alphabetic suffixes may signify different examples of the similar part or element. The attached drawings are intended to, illustratively instead of restrictively, demonstrate various embodiments that are discussed herein in the specification.

DESCRIPTION OF EMBODIMENTS

In the following description, a load switch having the reverse current blocking (RCB) function is referred to as an RCB load switch.

Figure 1:
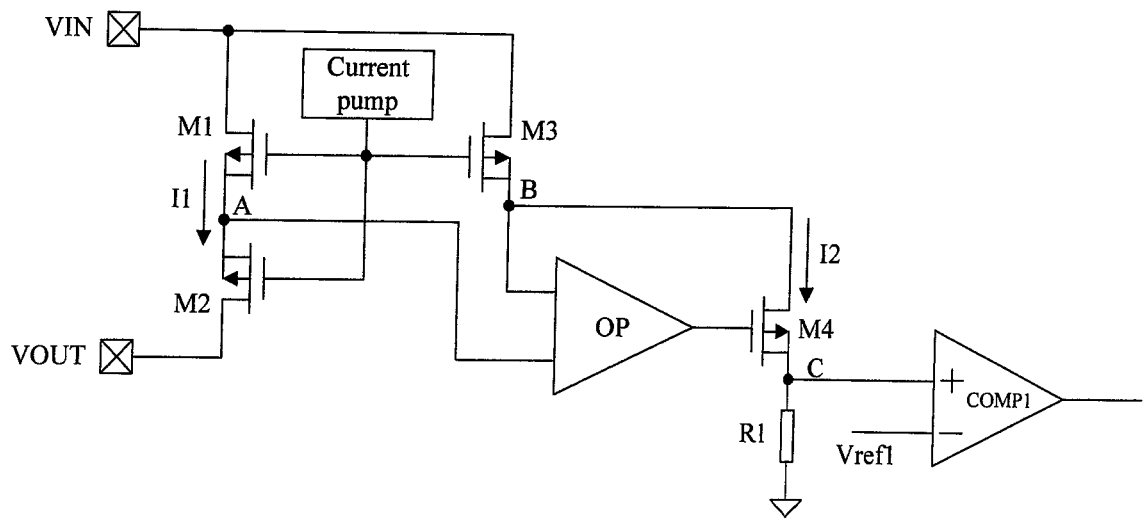
FIG. 1 is a schematic structural diagram of an overcurrent protection circuit according to an embodiment of the present invention.

FIG. 1 is a schematic structural diagram of an overcurrent protection circuit of an RCB load switch according to an embodiment of the present invention. As illustrated in FIG. 1, when a voltage of an output terminal VOUT is high, that is, after power NMOSFETs M1 and M2 are conducted and the voltage of the output terminal VOUT has risen to a defined voltage value, in this case, the overcurrent protection circuit as illustrated in FIG. 1 is used to perform effective detection for a current I1 flowing through M1 and M2. When it is detected that the current I1 flowing through M1 and M2 is greater than or equal to a preset threshold, M1 and M2 are turned off. In this way, an overcurrent flowing through M1 and M2 may be protected. However, when the voltage of the output terminal VOUT is lower or the output terminal VOUT is connected to the ground (GND), that is, when M1 and M2 are just conducted and the output terminal VOUT just outputs a voltage, meaning that the voltage rises from 0 V, the overcurrent protection circuit as illustrated in FIG. 1 fails to perform effective detection for the current I1 flowing through M1 and M2. This is because: after a charge pump starts to work, the current output by the charge pump causes M1, M2, and M3 to be conducted, and then a great current flows from an input terminal VIN to the output terminal VOUT. In this case, since the voltage of the output terminal VOUT is lower or the output terminal VOUT is connected to the ground (GND), a voltage at point A is equal to the voltage of the output terminal VOUT, that is, the voltage at point A is close to 0 V whereas a voltage at point B is equal to I2×R1, and therefore, the voltage at point A is not equal to the voltage at point B, which results in a current mirror ratio error is great and a current mirror ratio is less than a preset value K, that is, the current I2 fails to actually reflect the value of the current I1. Under such circumstances, when the current I1 is greater than or equal to the preset threshold, since the current I2 fails to actually reflect the value of the current I1, the value of I2×R1 is still less than a reference voltage Vref1; and thus a comparator COMP1 still outputs a low voltage signal and hence the charge pump continues working, such that M1 and M2 are in a conduction state, which may result in that the power NMOSFETs M1 and M2 are damaged due to the great current.

In view of the above, in the following various embodiments of the present invention, a first overcurrent detection sub-circuit performs overcurrent detection for a switch circuit when a voltage of an output terminal of the switch circuit is greater than or equal to a preset threshold; and a second overcurrent detection sub-circuit performs overcurrent detection for the switch circuit when the voltage of the output terminal of the switch circuit less than the preset threshold.

The present invention is described hereinafter in detail with reference to the attached drawings and specific embodiments.

Figure 2:
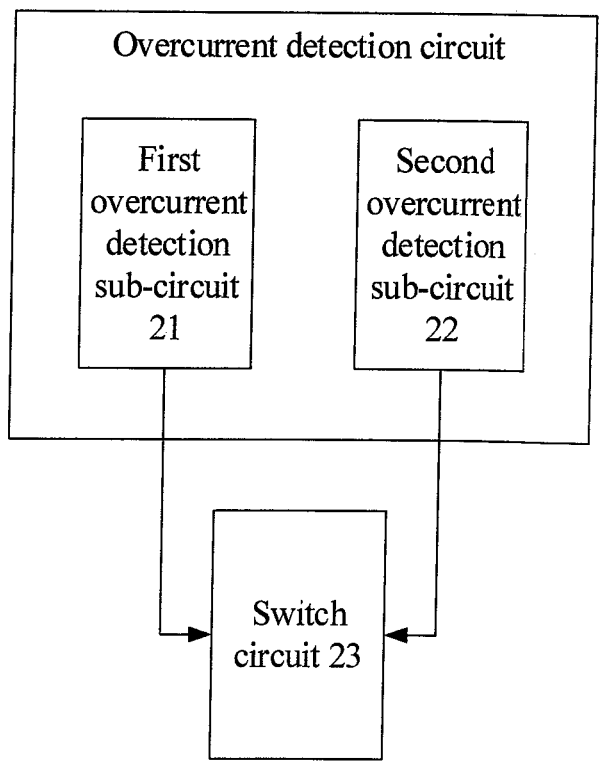
FIG. 2 is a schematic structural diagram of a first overcurrent detection circuit according to an embodiment of the present invention.

An embodiment of the present invention provides an overcurrent detection circuit. As illustrated in FIG. 2, the overcurrent detection circuit comprises: a first overcurrent detection sub-circuit 21 and a second overcurrent detection sub-circuit 22; wherein:

the first overcurrent detection sub-circuit 21 performs overcurrent detection for a switch circuit 23 when a voltage of an output terminal of the switch circuit 23 is greater than or equal to a preset threshold; and the second overcurrent detection sub-circuit 22 performs overcurrent detection for the switch circuit 23 when the voltage of the output terminal of the switch circuit 23 is less than the preset threshold.

Herein, in practical application, the overcurrent detection circuit provided in the embodiment of the present invention may be applicable to an application scenario where the switch circuit 23 is in a conduction state. The switch circuit 23 being in a conduction state refers to current flowing through switch circuit 23.

The threshold may be defined according to needs of a designed circuit.

The switch circuit 23 is implemented by using a metal-oxide-semiconductor field-effect transistor (MOSFET), and more specifically, is implemented by using an N-channel metal-oxide-semiconductor field-effect transistor (NMOSFET) or a p-channel metal-oxide-semiconductor field-effect transistor (PMOSFET). In practical application, in consideration of costs, the switch circuit 23 is generally implemented by using an NMOSFET.

Figure 3:
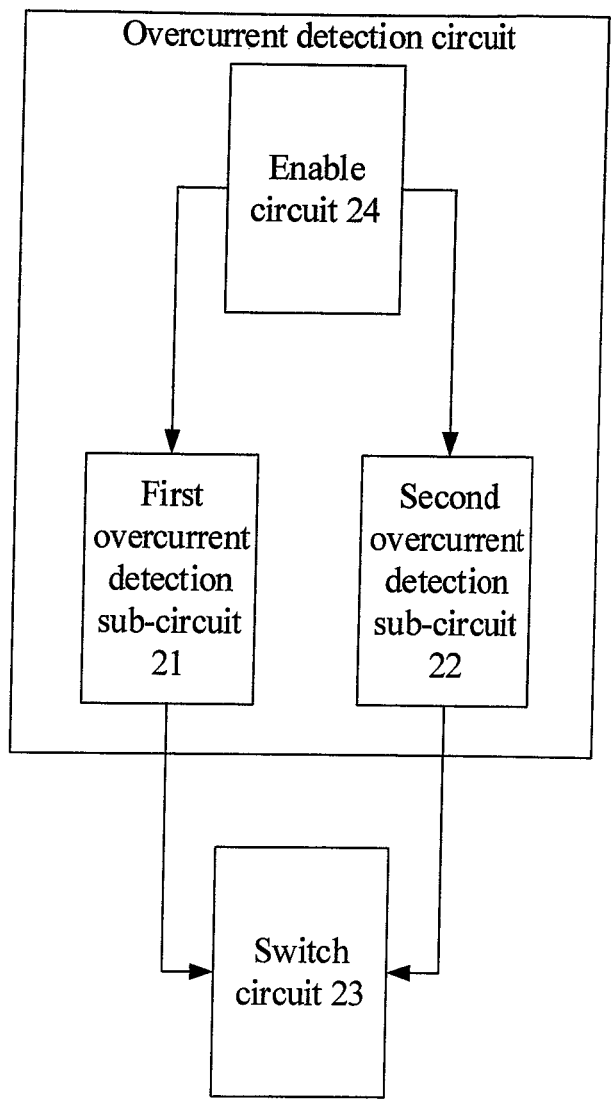
FIG. 3 is a schematic structural diagram of a second overcurrent detection circuit according to an embodiment of the present invention.

As illustrated in FIG. 3, the overcurrent detection circuit may further comprise an enable circuit 24. The enable circuit 24 inputs an enable signal to the first overcurrent detection sub-circuit 21 when the voltage of the output terminal of the switch circuit 23 is greater than or equal to the preset threshold, and correspondingly, the first overcurrent detection sub-circuit 21 performs overcurrent detection for the switch circuit 23 upon receiving the enable signal input by the enable circuit 24. The enable circuit 24 inputs an enable signal to the second overcurrent detection sub-circuit 22 when the voltage of the output terminal of the switch circuit 23 is less than the preset threshold, and the second overcurrent detection sub-circuit 22 performs overcurrent detection for the switch circuit 23 upon receiving the enable signal input by the enable circuit 24.

Figure 4:
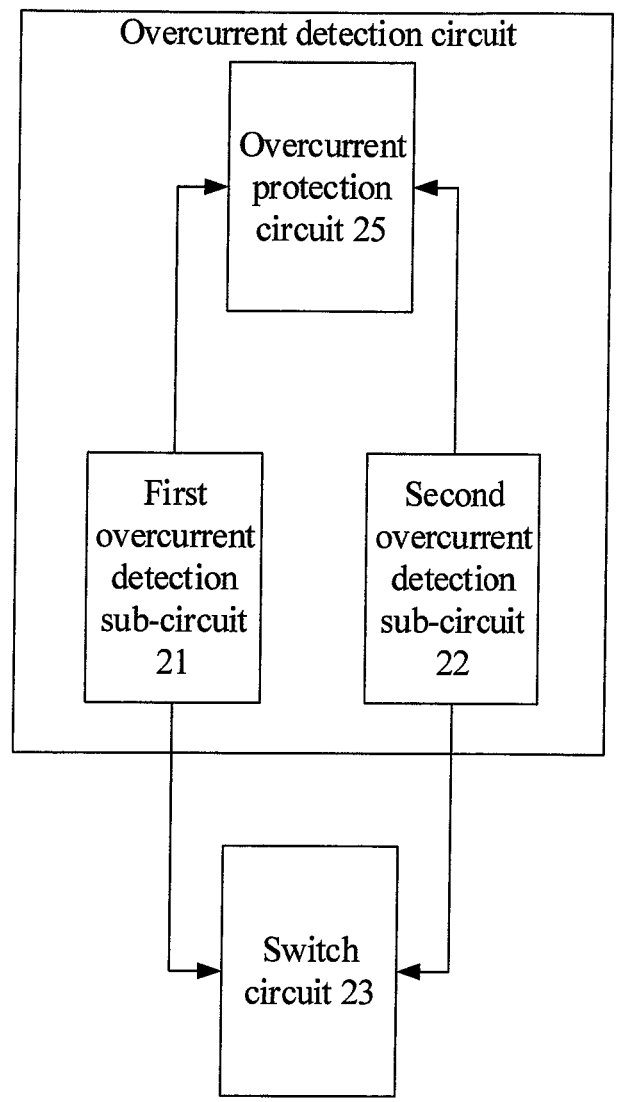
FIG. 4 is a schematic structural diagram of a third overcurrent detection circuit according to an embodiment of the present invention.
Figure 5:
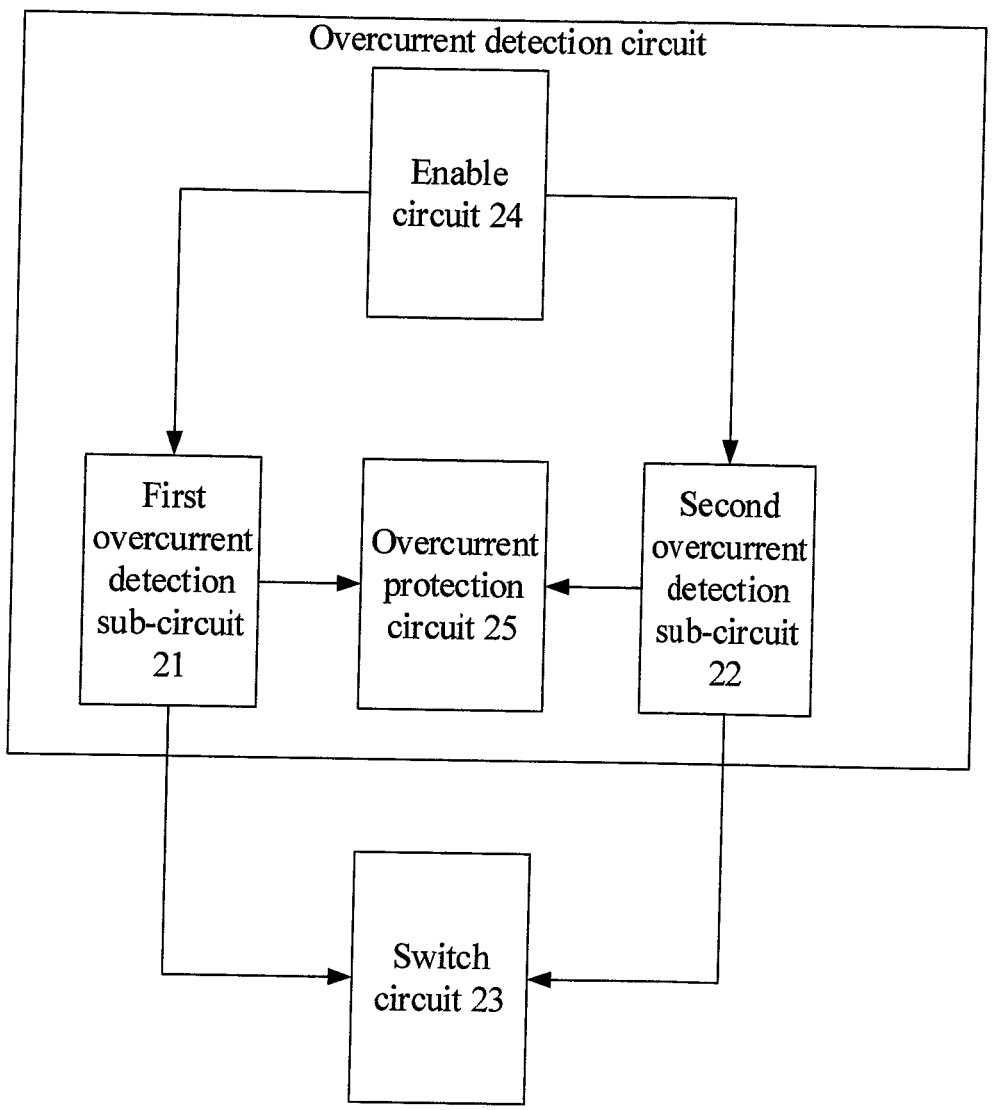
FIG. 5 is a schematic structural diagram of a fourth overcurrent detection circuit according to an embodiment of the present invention.

As shown in FIGS. 4 and 5, the overcurrent detection circuit may further comprise an overcurrent protection circuit 25. The first overcurrent detection sub-circuit 21 or the second overcurrent detection sub-circuit 22 sends an overcurrent result of the switch circuit 23 to the overcurrent protection circuit 25 when the first overcurrent detection sub-circuit 21 or the second overcurrent detection sub-circuit 22 detects that the switch circuit 23 is subjected to an overcurrent. The overcurrent protection circuit 25 enables the switch circuit 23 to stay in an OFF state upon receiving the overcurrent result of the switch circuit 23 sent by the first overcurrent detection sub-circuit 21 or the second overcurrent detection sub-circuit 22. In this way, the switch circuit 23 may be effectively protected from damage, such that the switch circuit 23 can be protected. Herein, detecting that the switch circuit 23 being subjected to an overcurrent refers to that the current flowing through the switch circuit 23 is greater than a preset current threshold; the switch circuit 23 being in an OFF state refers to that no current flows through the switch circuit 23.

Figure 6:
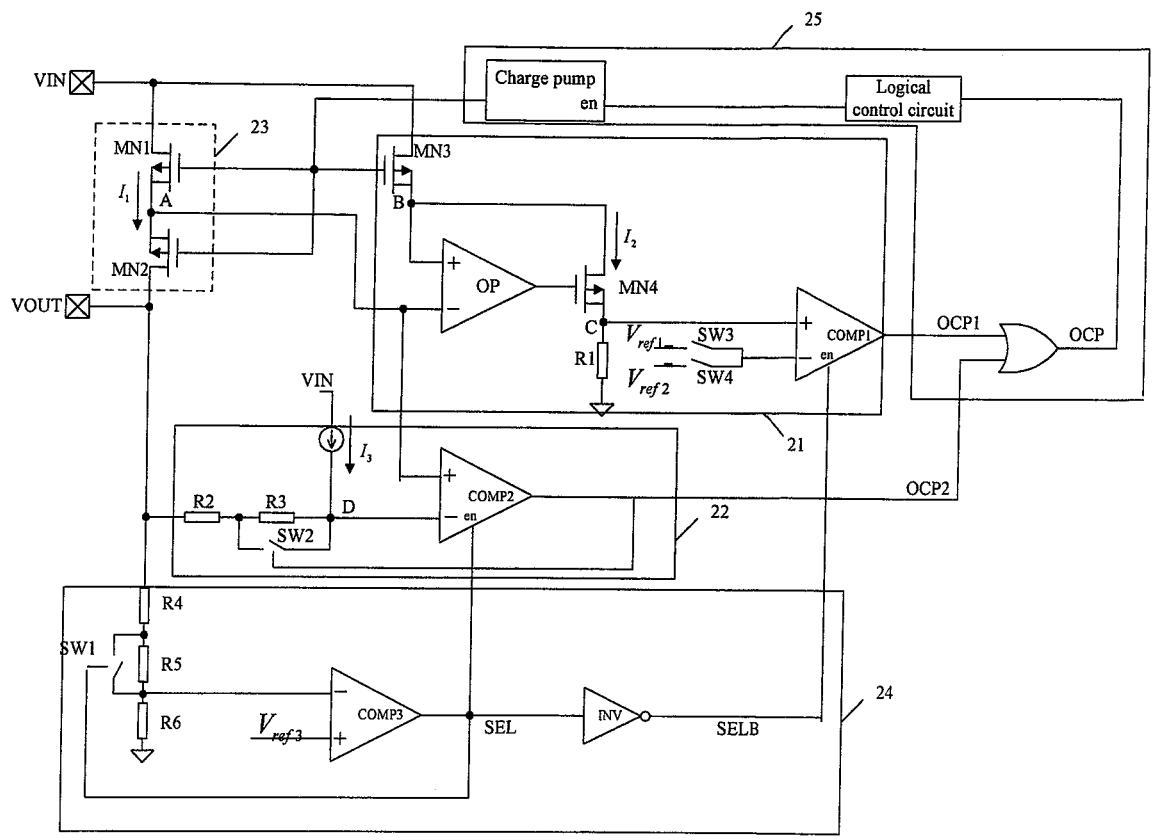
FIG. 6 is a schematic structural diagram of an application example of an overcurrent detection circuit according to an embodiment of the present invention.

FIG. 6 is a schematic structural diagram of an application example of an overcurrent detection circuit according to an embodiment of the present invention. As illustrated in FIG. 6, the switch circuit 23 comprises: a first NMOSFET MN1 and a second NMOSFET MN2; the first overcurrent detection sub-circuit 21 comprises: a third NMOSFET MN3, an operational amplifier (OP), a fourth NMOSFET MN4, a first resistor R1, a third switch SW3, a fourth switch SW4, and a first comparator COMP1; the second overcurrent detection sub-circuit 22 comprises: a reference current source $I_0$, a second resistor R2, a third resistor R3, a second switch SW2, and a second comparator COMP2; the enable circuit 24 comprises: a first switch SW1, a fourth resistor R4, a fifth resistor R5, a sixth resistor R6, a third comparator COMP3, and an inverter INV; and the overcurrent protection circuit 25 comprises: an OR gate circuit, a logic control circuit, and a charge pump; wherein the first switch SW1, the second switch SW2, the third switch SW3, a fourth switch SW4 are all single-pole single-throw switches, and the third switch SW3 and the fourth switch SW4 form a single-pole double-throw switch.

The coupling relationship among components of the overcurrent detection circuit as illustrated shown in FIG. 6 is as follows:

in the switch circuit 23, a gate of the first NMOSFET MN1 is connected to the charge pump of the overcurrent protection circuit 25; a drain of the first NMOSFET MN1 is connected to a voltage input node VIN; a source of the first NMOSFET MN1 is connected to a source of the second NMOSFET MN2, an inverting input terminal of the operational amplifier OP, and a positive input terminal of the second comparator COMP2 of the second overcurrent detection sub-circuit 22; a gate of the second NMOSFET MN2 is connected to the charge pump of the overcurrent protection circuit 25; and a drain of the second NMOSFET MN2 is connected to a voltage output node VOUT, one terminal of the second resistor R2 of the second overcurrent detection sub-circuit 22, and one terminal of the fourth resistor R4 of the enable circuit 24;

in the first overcurrent detection sub-circuit 21, a gate of the third NMOSFET MN3 is connected to the charge pump of the overcurrent protection circuit 25; a drain of the third NMOSFET MN3 is connected to the voltage input node VIN; a source of the third NMOSFET MN3 is connected to a non-inverting input terminal of the operational amplifier OP and a drain of the fourth NMOSFET MN4; an output terminal of the operational amplifier OP is connected to a gate of the fourth NMOSFET MN4; a source of the fourth NMOSFET MN4 is connected to one terminal of the first resistor R1 and a positive input terminal of the first comparator COMP1; the other terminal of the first resistor R1 is grounded; a negative input terminal of the first comparator COMP1 is connected to one terminal of the third switch SW3 and one terminal of the fourth switch SW4; the other terminal of the third switch SW3 is connected to a node outputting a first reference voltage; the other terminal of the fourth switch SW4 is connected to a node outputting a second reference voltage; and an output terminal of the first comparator COMP1 is connected to a first input terminal of the OR gate circuit of the overcurrent protection circuit 25;

in the second overcurrent detection sub-circuit 22, the other terminal of the second resistor R2 is connected to one terminal of the third resistor R3 and a first terminal of the second switch SW2; the other terminal of the third resistor R3 is connected to a second terminal of the second switch SW2, one terminal of the reference current source $I_0$, and a negative input terminal of the second comparator COMP2; the other terminal of the reference current source $I_0$ is connected to the voltage input node VIN; and an output terminal of the second comparator COMP2 is connected to a third terminal of the second switch SW2 and a second input terminal of the OR gate circuit of the overcurrent protection circuit 25;

in the enable circuit 24, the other terminal of the fourth resistor R4 is connected to one terminal of the fifth resistor R5 and a first terminal of the first switch SW1; the other terminal of the fifth resistor R5 is connected to a second terminal of the first switch SW1, one terminal of the sixth resistor R6, and a negative input terminal of the third comparator COMP3; the other terminal of the sixth resistor R6 is grounded; a positive input terminal of the third comparator COMP3 is connected to a node outputting a third reference voltage; an output terminal of the third comparator COMP3 is connected to a third terminal of the first switch SW1, an enable input terminal of the second comparator COMP2, and an input terminal of the inverter INV; and an output terminal of the inverter INV is connected to an enable input terminal of the first comparator COMP1; and in the overcurrent protection circuit 25, an output terminal of the OR gate circuit is connected to an input terminal of the logic control circuit; and an output terminal of the logic control circuit is connected to an enable input terminal of the charge pump.

The following specifically describes the working principle of an overcurrent detection circuit as illustrated in FIG. 6.

For ease of description, in the following description, a voltage of a voltage output contact is referred to as $V_{out}$, a first reference voltage is referred to as $V_{ref1}$, a second reference voltage is referred to as $V_{ref2}$, and a third reference voltage is referred to as $V_{ref3}$; a resistance of the first resistor R1 is referred to as $R_1$, a resistance of second resistor R2 is referred to as $R_2$, a resistance of the third resistor R3 is referred to as $R_3$, a resistance of the fourth resistor R4 is referred to as $R_4$, a resistance of the fifth resistor R5 is referred to as $R_5$, and a resistance of the sixth resistor R6 is referred to as $R_6$; a connection point formed by a first NMOSFET MN1, a second NMOSFET MN2 and an operational amplifier OP is referred to as a point A, and the corresponding voltage is referred to as $V_A$; a connection point formed by a third NMOS MN3, an operational amplifier OP, and a fourth NMOSFET MN4 is referred to as a point B; a connection point formed by a fourth NMOSFET MN4, the first resistor R1, and a first comparator COMP1 is referred to as a point C; a connection point formed by a reference current source $I_0$, the third resistor R3, and a second comparator COMP2 is referred to as a point D, and the corresponding voltage is referred to as $V_D$; a connection point formed by the second comparator COMP2, a third comparator COMP3, and an inverter INV is referred to as SEL; a connection point formed by the inverter INV and the first comparator COMP1 is referred to as SELB; a connection point formed by the first comparator COMP1 and an OR gate circuit is referred to as an OCP1; and a connection point formed by the second comparator COMP2 and the OR gate circuit is referred to as an OCP2.

The working principle of an enable circuit 24 is described as follows: when $$V_{out} < V_{ref3} \cdot \frac{R_4 + R_5 + R_6}{R_6},$$

the first switch SW1 is disconnected, such that the third comparator COMP3 outputs a high voltage signal, whereas the inverter INV outputs a low voltage signal, that is, the voltage of the point SEL is a high voltage, the voltage of the point SELB is 0, and the high voltage signal output by the third comparator COMP3 enables the second comparator COMP2, such that the second comparator COMP2 works; in this case, the low voltage signal output by the inverter INV cannot enable the first comparator COMP1, and thus the first comparator COMP1 does not work; in other words, the second overcurrent detection sub-circuit 22 works whereas the first overcurrent detection sub-circuit 21 does not work.

When $$V_{out} \geq V_{ref3} \cdot \frac{R_4 + R_5 + R_6}{R_6},$$

the first switch SW1 is conducted, such that the third comparator COMP3 outputs a low voltage signal, whereas the inverter INV outputs a high voltage signal, that is, the voltage of the point SEL is 0, the voltage of the point SELB is a high voltage, and the high voltage signal output by the inverter INV enables the first comparator COMP1, such that the first comparator COMP1 works; in this case, the low voltage signal output by the third comparator COMP3 cannot enable the second comparator COMP2, and thus the second comparator COMP2 does not work; in other words, the first overcurrent detection sub-circuit 21 works whereas second overcurrent detection sub-circuit 22 does not work; since the first switch SW1 is conducted, only when $$V_{out} < V_{ref3} \cdot \frac{R_4 + R_6}{R_6},$$

the first switch SW1 is disconnected, the third comparator COMP3 can output high voltage signal whereas the inverter INV can output a low voltage signal.

Herein, whether the fifth resistor R5 is short circuited is controlled by using a connection and disconnection of the first switch SW1, and then a detection point of the voltage of the voltage output terminal VOUT is changed; in other words, the effects of the first switch SW1, the fourth resistor R4, the fifth resistor R5, and the sixth resistor R6 are to implement the delay function. The high voltage signal refers to an output signal of the third comparator COMP3 when it is indicated that $$V_{out} < V_{ref3} \cdot \frac{R_4 + R_5 + R_6}{R_6};$$

the low voltage signal refers to an output signal of the third comparator COMP3 when it is indicated that $$V_{out} \geq V_{ref3} \cdot \frac{R_4 + R_5 + R_6}{R_6};$$

and for example, assume that the output signal of the third comparator COMP3 comprises two types of signals 0 and 1, 1 is the high voltage signal, and 0 is the low voltage signal.

The working principle of the first overcurrent detection sub-circuit 21 is described as follows: when $I_1 < V_{ref1}/R_1 \cdot K$, the third switch SW3 is conducted, and the fourth switch SW4 is disconnected, such that the first comparator COMP1 outputs a low voltage signal, that is, the voltage of the point OCP1 is 0; when $I_1$ gradually increases, and $I_1 \geq V_{ref2}/R_1 \cdot K$, the fourth switch SW4 is conducted, and the third switch SW3 is disconnected, such that the first comparator COMP1 outputs a high voltage signal, that is, the voltage of the point OCP1 is a high voltage; in this case, it is indicated that the current flowing through the first NMOSFET MN1 and the second NMOSFET MN2 is great, and an overcurrent is present; in other words, the first overcurrent detection sub-circuit 21 detects that the overcurrent of the first NMOSFET MN1 and the second NMOSFET MN2; only when $I_1$ is gradually reduced, and $I_1 \leq V_{ref1}/R_1 \cdot K$, the third switch SW3 is conducted again, and the fourth switch SW4 is disconnected again, such that the first comparator COMP1 re-outputs a low voltage signal; as such the delay may be effectively implemented and accuracy in detection may be ensured; wherein $I_1$ indicates the current flowing through the first NMOSFET MN1 and the second NMOSFET MN2, K indicates the current mirror ratio, and $V_{ref1} < V_{ref2}$. Herein, the high voltage signal refers to an output signal of the first comparator COMP1 when it is indicated that $I_1 \geq V_{ref2}/R_1 \cdot K$; the low voltage signal refers to an output signal of the first comparator COMP1 when it is indicated that $I_1 < V_{ref2}/R_1 \cdot K$; and for example, assume that the output signal of the first comparator COMP1 comprises two types of signals 0 and 1, 1 is the high voltage signal, and 0 is the low voltage signal.

The working principle of the second overcurrent detection sub-circuit 22 is described as follows: when $V_A < V_D$, the second switch SW2 is disconnected; since $V_A = V_{out} + I_1 \cdot Rdson_{MN2}$ and $V_D = V_{out} + I_3 \cdot (R_2 + R_3)$, when $I_1 \cdot Rdson_{MN2} < I_3 \cdot (R_2 + R_3)$, the second comparator COMP2 outputs a low voltage signal, that is, the voltage of the point OCP2 is 0; when $V_A \geq V_D$, the second switch SW2 is conducted, that is, when $I_1 \cdot Rdson_{MN2} \geq I_3 \cdot (R_2 + R_3)$, the third resistor R3 is short circuited, and the second comparator COMP2 outputs a high voltage signal, that is, the voltage of the point OCP2 is a high voltage; in this case, it is indicated that the current flowing through the first NMOSFET MN1 and the second NMOSFET MN2 is too great, and an overcurrent is present; in other words, the second overcurrent detection sub-circuit 22 detects that the overcurrent of the first NMOSFET MN1 and the second NMOSFET MN2; only when $V_D$ is reduced, and $I_1 \cdot Rdson_{MN2} \leq I_3 \cdot R_2$ the second switch SW2 is disconnected again, and the voltage of the point OCP2 changes again from a high voltage to a low voltage; in this way, delay may be effectively implemented and accuracy in detection may be ensured. $I_1$ indicates the current flowing through the first NMOSFET MN1 and the second NMOSFET MN2, $Rdson_{MN2}$ indicates a conduction resistance of the second NMOSFET MN2, and $I_3$ indicates the current output by the reference current source $I_0$.

Herein, since during conduction of the second NMOSFET MN2, $Rdson_{MN2}$ is a resistance gradually changing from a great value to a small value, and in addition, since $I_1$ gradually changes from a small value to a great value, a voltage drop at two terminals of the drain of the second NMOSFET MN2 is an ever-changing value, and gradually increases with the increase of the voltage of the gate of the second NMOSFET MN2; therefore, in practical application, a maximum voltage value $V_{max}$ needs to be obtained via a simulation experiment during normal power-on of the voltage output connection point, and $I_3 \cdot (R_2 + R_3)$ needs to be greater than $V_{max}$; as such, it may be ensured that during normal power-on of the voltage output connection point of the second comparator COMP2, no high voltage signal is mistakenly output; in other words, it may be ensured that the second overcurrent detection sub-circuit 22 may not be subjected to false detection during normal power-on of the voltage output connection point; in addition, the value of $I_3 \cdot (R_2+R_3)$ shall not be too great, and only in this way, it may be ensured that the first overcurrent detection sub-circuit 21 and the second overcurrent detection sub-circuit 22 orderly work, such that the effect of overcurrent protection is practically achieved.

Herein, the high voltage signal refers to an output signal of the second comparator COMP2 when it is indicated that $V_A \geq V_D$; the low voltage signal refers to an output signal of the second comparator COMP2 when it is indicated that $V_A < V_D$; and for example, assume that the output signal of the second comparator COMP2 comprises two types of signals 0 and 1, 1 is the high voltage signal, and 0 is the low voltage signal.

The working principle of the overcurrent protection circuit 25 is described as follows: after the OR gate circuit receives a high voltage signal output by the first comparator COMP1 or a high voltage signal output by the second comparator COMP2, the high voltage signal is input to the logic control circuit; upon receiving the high voltage signal, the logic control circuit stops outputting an enable signal to the charge pump, such that the charge pump is turned off; after the charge pump is turned off, the first NMOSFET MN1 and the second NMOSFET MN2 are disabled, such that the effect of overcurrent protection is achieved.

It shall be noted that: when the overcurrent detection circuit as illustrated in FIG. 6 is employed, if the first overcurrent detection sub-circuit 21 is singly used, that is, only when the VOUT voltage value is low or close to the GND, $V_A$ is equal to $V_{out}$ whereas the voltage of point B is equal to $I_2 \times R_1$; therefore, the voltage of point A is not equal to the voltage of point B, and thus an error of the current mirror ratio K is extremely great; as a result, when $I_1$ is extremely great, $I_2 \times R_1$ is still less than $V_{ref2}$, and thus the first NMOSFET MN1 and the second NMOSFET MN2 are damaged due to a great current; however, after the second overcurrent detection sub-circuit 22 works, the problem that detection of the current flowing through the switch circuit 23 is not accurate when $V_{out}$ is very low. However, in practical application, it shall be noted that a suitable voltage threshold needs to be defined for the path on which the first overcurrent detection sub-circuit 21 and the second overcurrent detection sub-circuit 22 work; if a too small threshold is defined, when $V_{out}$ is low but still greater than the defined threshold, since the first overcurrent detection sub-circuit 21 performs overcurrent detection for the switch circuit 23, the current mirror may not be accurate, and thus the switch circuit 23 may tend to be damaged; if a too great threshold is defined, when $V_{out}$ is high but still less than the defined threshold, since the second overcurrent detection sub-circuit 22 performs overcurrent detection for the switch circuit 23, the value of $V_D$ may be very close to the voltage of the voltage input node VIN, and thus $I_3$ changes smaller and accordingly the value of $I_3 \cdot (R_2+R_3)$ changes smaller; in this way, mistaken triggering of the overcurrent protection may tend to occur, that is, $V_A > V_D$; as a result, the second comparator COMP2 outputs a high voltage signal, which mistakenly triggers the overcurrent protection, such that the first NMOSFET MN1 and the second NMOSFET MN2 are disabled, and thus the corresponding chips fail to properly work. $I_2$ indicates the current flowing through the fourth NMOSFET MN4.

Figure 7:
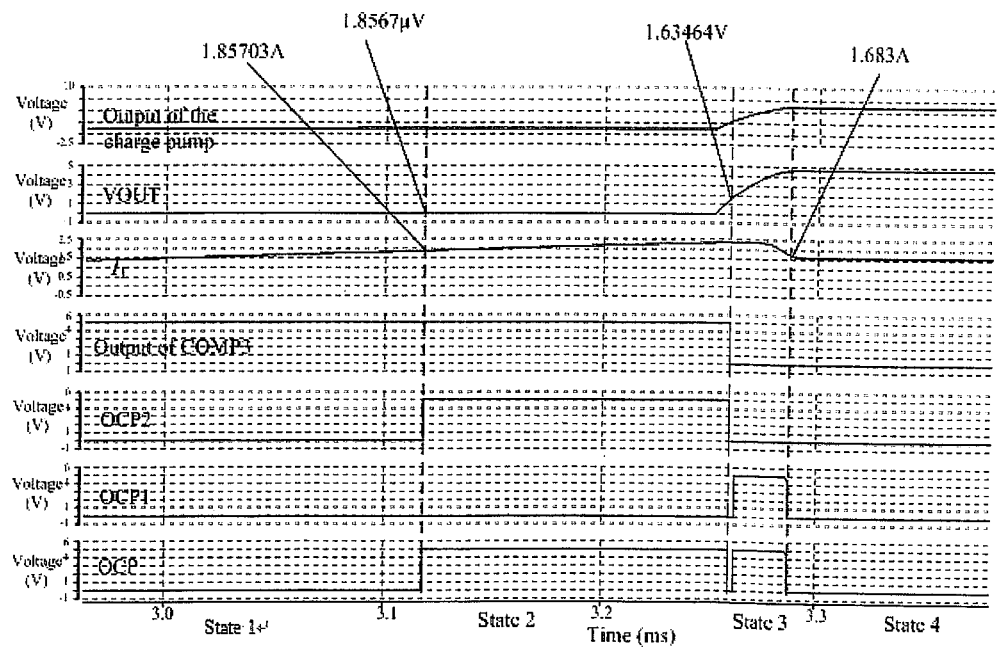
FIG. 7 is a schematic structural diagram of a simulation result of an overcurrent detection circuit according to an embodiment of the present invention.

FIG. 7 is a simulation diagram illustrating various sub-circuits according to the technical solutions provided in the embodiments of the present invention. As seen from FIG. 7:

In state 1, that is, the power-on stage of the voltage output node VOUT, the voltage output node VOUT is short circuited to the ground, and the third comparator COMP3 outputs a high voltage signal; therefore, the second overcurrent detection sub-circuit 22 works whereas the first overcurrent detection sub-circuit 21 does not work; in other words, the first comparator COMP1 outputs a low voltage signal, that is, the voltage of the point OCP1 is 0; in this state, the voltage output by the charge pump is gradually increased, and in this case, the current $I_1$ flowing through the first NMOSFET MN1 and the second NMOSFET MN2 is less than or equal to a preset value; therefore, the second comparator COMP2 outputs a low voltage signal, that is, the voltage of the point OCP2 is 0, and thus the voltage of the output terminal OCP of the OR gate circuit is also 0.

In state 2, the voltage output node VOUT is still short circuited to the ground, and the third comparator COMP3 outputs a high voltage signal; therefore, the second overcurrent detection sub-circuit 22 works whereas the first overcurrent detection sub-circuit 21 does not work; in other words, the first comparator COMP1 outputs a low voltage signal, that is, the voltage of the point OCP1 is 0; in this state, the voltage output by the charge pump is still gradually increased, and with the further increase of the voltage output by the charge pump, the current $I_1$ flowing through the first NMOSFET MN1 and the second NMOSFET MN2 is greater than a preset value; therefore, the second comparator COMP2 outputs a high voltage signal, that is, the voltage of the point OCP2 is a high voltage, and thus the voltage of the output terminal OCP of the OR gate circuit is also a high voltage.

In state 3, that is, the voltage output node VOUT has been normally powered on, $$V_{out} > V_{ref3} \cdot \frac{R_4 + R_5 + R_6}{R_6},$$

and therefore, the third comparator COMP3 outputs a low voltage signal, and the first overcurrent detection sub-circuit 21 works whereas the second overcurrent detection sub-circuit 22 does not work; in other words, the second comparator COMP2 outputs a low voltage signal, that is, the voltage of the point OCP2 is 0; in this state, the voltage output by the charge pump is still gradually increased, when the current $I_1$ flowing through the first NMOSFET MN1 and the second NMOSFET MN2 is less than or equal to the preset value $V_{ref2}/R_1 \cdot K$, the first comparator COMP1 outputs a low voltage signal, that is, the voltage of the point OCP2 is 0, and thus the voltage of the output terminal OCP of the OR gate circuit is also 0; when the current $I_1$ flowing through the first NMOSFET MN1 and the second NMOSFET MN2 is greater than the preset value $V_{ref2}/R_1 \cdot K$, the first comparator outputs a high voltage signal, that is, the voltage of the point OCP1 is a high voltage, and thus the voltage output by the output terminal OCP of the OR gate circuit is also a high voltage.

In state 4, the voltage output node VOUT has still been normally powered on; in this case, $$V_{out} > V_{ref3} \cdot \frac{R_4 + R_5 + R_6}{R_6},$$

and therefore the third comparator COMP3 outputs a low voltage signal, and the first overcurrent detection sub-circuit 21 works whereas the second overcurrent detection sub-circuit 22 does not work; in other words, the second comparator COMP2 outputs a low voltage signal, that is, the voltage of the point OCP2 is 0; in this state, the charge pump is turned off, and when the current $I_1$ flowing through the first NMOSFET MN1 and the second NMOSFET MN2 starts to decrease and when the current $I_1$ flowing through the first NMOSFET MN1 and the second NMOSFET MN2 decreases to be less than or equal to $V_{refl}/R_1 \cdot K$, the first comparator COMP1 outputs a low voltage signal, that is, the voltage of the point OCP1 is 0, and thus the voltage output by the output terminal OCP of the OR gate circuit is also 0.

As seen from the above description, with the technical solutions provided in the embodiments of the present invention, overcurrents present during the process from start-up of power-on to normal power-on and working may be effectively detected.

Based on the above overcurrent detection circuit, an embodiment of the present invention further provides an overcurrent detection method. The method comprises: performing, by a first overcurrent detection sub-circuit of an overcurrent detection circuit, overcurrent detection for a switch circuit when a voltage of an output terminal of the switch circuit is greater than or equal to a preset threshold; and performing, by a second overcurrent detection sub-circuit of the overcurrent detection circuit, overcurrent detection for the switch circuit when the voltage of the output terminal of the switch circuit is less than the preset threshold.

Herein, the threshold may be defined according to needs of a designed circuit.

The method may further comprise: outputting an enable signal to the first overcurrent detection sub-circuit when the voltage of the output terminal of the switch circuit is greater than or equal to the preset threshold, and correspondingly, performing, by the second overcurrent detection sub-circuit, overcurrent detection for the switch circuit upon receiving the enable signal; or outputting an enable signal to the second overcurrent detection sub-circuit when the voltage of the output terminal of the switch circuit is less than the preset threshold, and correspondingly, performing, by the second overcurrent detection sub-circuit, overcurrent detection for the switch circuit upon receiving the enable signal.

The method may further comprise: enabling the switch circuit to stay in an OFF state when it is detected that the switch circuit is subjected to an overcurrent. In this way, the switch circuit may be effectively protected from damage, thereby achieving the effect of protecting the switch circuit from overcurrent. Herein, detecting that the switch circuit is subjected to an overcurrent refers to that the current flowing through the switch circuit is greater than a preset current threshold; the switch circuit being in an OFF state refers to that no current flows through the switch circuit.

Based on the above overcurrent detection circuit, an embodiment of the present invention further provides a load switch, wherein the load switch comprises an overcurrent detection circuit. As illustrated in FIG. 2, the overcurrent detection circuit comprises: a first overcurrent detection sub-circuit 21 and a second overcurrent detection sub-circuit 22; wherein:

the first overcurrent detection sub-circuit 21 performs overcurrent detection for a switch circuit 23 when a voltage of an output terminal of the switch circuit 23 is greater than or equal to a preset threshold; and the second overcurrent detection sub-circuit 22 performs overcurrent detection for the switch circuit 23 when the voltage of the output terminal of the switch circuit 23 is less than the preset threshold.

Herein, in practical application, the overcurrent detection circuit provided in the embodiment of the present invention may be applicable to an application scenario where the switch circuit 23 is in a conduction state. The switch circuit 23 being in a conduction state refers to that the switch circuit 23 is subjected to a current therethrough.

The threshold may be defined according to needs of a designed circuit.

The switch circuit 23 may be implemented by using a MOSFET, and more particularly, may be implemented by using an NMOSFET or a PMOSFET. In practical application, in consideration of costs, in consideration of costs, the switch circuit 23 is generally implemented by using an NMOSFET.

As illustrated in FIG. 3, the overcurrent detection circuit may further comprise an enable circuit 24. The enable circuit 24 inputs an enable signal to the first overcurrent detection sub-circuit 21 when the voltage of the output terminal of the switch circuit 23 is greater than or equal to the preset threshold, and correspondingly, the first overcurrent detection sub-circuit 21 performs overcurrent detection for the switch circuit 23 upon receiving the enable signal input by the enable circuit 24. The enable circuit 24 inputs an enable signal to the second overcurrent detection sub-circuit 22 when the voltage of the output terminal of the switch circuit 23 is less than the preset threshold, and the second overcurrent detection sub-circuit 22 performs overcurrent detection for the switch circuit 23 upon receiving the enable signal input by the enable circuit 24.

As shown in FIGS. 4 and 5, the overcurrent detection circuit may further comprise an overcurrent protection circuit 25. The first overcurrent detection sub-circuit 21 or the second overcurrent detection sub-circuit 22 sends an overcurrent result of the switch circuit 23 to the overcurrent protection circuit 25 when the first overcurrent detection sub-circuit 21 or the second overcurrent detection sub-circuit 22 detects that the switch circuit 23 is subjected to an overcurrent. The overcurrent protection circuit 25 enables the switch circuit 23 to stay in an OFF state upon receiving the overcurrent result of the switch circuit 23 sent by the first overcurrent detection sub-circuit 21 or the second overcurrent detection sub-circuit 22. In this way, the switch circuit 23 may be effectively protected from damage, such that the switch circuit 23 can be protected. Herein, detecting that the switch circuit 23 being subjected to an overcurrent refers to that the current flowing through the switch circuit 23 is greater than a preset current threshold; the switch circuit 23 being in an OFF state refers to that no current flows through the switch circuit 23.

FIG. 6 is a schematic structural diagram of an application example of an overcurrent detection circuit according to an embodiment of the present invention. As illustrated in FIG. 6, the switch circuit 23 comprises: a first NMOSFET MN1 and a second NMOSFET MN2; the first overcurrent detection sub-circuit 21 comprises: a third NMOSFET MN3, an operational amplifier (OP), a fourth NMOSFET MN4, a first resistor R1, a third switch SW3, a fourth switch SW4, and a first comparator (COMP1); the second overcurrent detection sub-circuit 22 comprises: a reference current source $I_0$, a second resistor R2, a third resistor R3, a second switch SW2, and a second comparator (COMP2); the enable circuit 24 comprises: a first switch SW1, a fourth resistor R4, a fifth resistor R5, a sixth resistor R6, a third comparator (COMP3), and an inverter INV; and the overcurrent protection circuit 25 comprises: an OR gate circuit, a logic control circuit, and a charge pump; wherein the first switch SW1, the second switch SW2, the third switch SW3, a fourth switch SW4 are all single-pole single-throw switches, and the third switch SW3 and the fourth switch SW4 form a single-pole double-throw switch.

The coupling relationship among components of the overcurrent detection circuit as illustrated shown in FIG. 6 is as follows:

in the switch circuit 23, a gate of the first NMOSFET MN1 is connected to the charge pump of the overcurrent protection circuit 25; a drain of the first NMOSFET MN1 is connected to a voltage input node VIN; a source of the first NMOSFET MN1 is connected to a source of the second NMOSFET MN2, an inverting input terminal of the operational amplifier OP, and a positive input terminal of the second comparator COMP2 of the second overcurrent detection sub-circuit 22; a gate of the second NMOSFET MN2 is connected to the charge pump of the overcurrent protection circuit 25; and a drain of the second NMOSFET MN2 is connected to a voltage output node VOUT, one terminal of the second resistor R2 of the second overcurrent detection sub-circuit 22, and one terminal of the fourth resistor R4 of the enable circuit 24;

in the first overcurrent detection sub-circuit 21, a gate of the third NMOSFET MN3 is connected to the charge pump of the overcurrent protection circuit 25; a drain of the third NMOSFET MN3 is connected to the voltage input node VIN; a source of the third NMOSFET MN3 is connected to a non-inverting input terminal of the operational amplifier OP and a drain of the fourth NMOSFET MN4; an output terminal of the operational amplifier OP is connected to a gate of the fourth NMOSFET MN4; a source of the fourth NMOSFET MN4 is connected to one terminal of the first resistor R1 and a positive input terminal of the first comparator COMP1; the other terminal of the first resistor R1 is grounded; a negative input terminal of the first comparator COMP1 is connected to one terminal of the third switch SW3 and one terminal of the fourth switch SW4; the other terminal of the third switch SW3 is connected to a node outputting a first reference voltage; the other terminal of the fourth switch SW4 is connected to a node outputting a second reference voltage; and an output terminal of the first comparator COMP1 is connected to a first input terminal of the OR gate circuit of the overcurrent protection circuit 25;

in the second overcurrent detection sub-circuit 22, the other terminal of the second resistor R2 is connected to one terminal of the third resistor R3 and a first terminal of the second switch SW2; the other terminal of the third resistor R3 is connected to a second terminal of the second switch SW2, one terminal of the reference current source $I_0$, and a negative input terminal of the second comparator COMP2; the other terminal of the reference current source $I_0$ is connected to the voltage input node VIN; and an output terminal of the second comparator COMP2 is connected to a third terminal of the second switch SW2 and a second input terminal of the OR gate circuit of the overcurrent protection circuit 25;

in the enable circuit 24, the other terminal of the fourth resistor R4 is connected to one terminal of the fifth resistor R5 and a first terminal of the first switch SW1; the other terminal of the fifth resistor R5 is connected to a second terminal of the first switch SW1, one terminal of the sixth resistor R6, and a negative input terminal of the third comparator COMP3; the other terminal of the sixth resistor R6 is grounded; a positive input terminal of the third comparator COMP3 is connected to a node outputting a third reference voltage; an output terminal of the third comparator COMP3 is connected to a third terminal of the first switch SW1, an enable input terminal of the second comparator COMP2, and an input terminal of the inverter INV; and an output terminal of the inverter INV is connected to an enable input terminal of the first comparator COMP1; and in the overcurrent protection circuit 25, an output terminal of the OR gate circuit is connected to an input terminal of the logic control circuit; and an output terminal of the logic control circuit is connected to an enable input terminal of the charge pump.

The following specifically describes the working principle of an overcurrent detection circuit as illustrated in FIG. 6.

For ease of description, in the following description, a voltage of a voltage output contact is referred to as $V_{out}$, a first reference voltage is referred to as $V_{ref1}$, a second reference voltage is referred to as $V_{ref2}$, and a third reference voltage is referred to as $V_{ref3}$; a resistance of the first resistor R1 is referred to as $R_1$, a resistance of the second resistor R2 is referred to as $R_2$, a resistance of the third resistor R3 is referred to as $R_3$, a resistance of the fourth resistor R4 is referred to as $R_4$, a resistance of the fifth resistor R5 is referred to as $R_5$, and a resistance of the sixth resistor R6 is referred to as $R_6$; a connection point formed by a first NMOSFET MN1, a second NMOSFET MN2 and an operational amplifier OP is referred to as a point A, and the corresponding voltage is referred to as $V_A$; a connection point formed by a third NMOS MN3, an operational amplifier OP, and a fourth NMOSFET MN4 is referred to as a point B; a connection point formed by a fourth NMOSFET MN4, the first resistor R1, and a first comparator COMP1 is referred to as point C; a connection point formed by a reference current source, the third resistor R3, and a second comparator COMP2 is referred to as point D, and the corresponding voltage is referred to as $V_D$; a connection point formed by the second comparator COMP2, a third comparator COMP3, and an inverter INV is referred to as SEL; a connection point formed by the inverter INV and the first comparator COMP1 is referred to as SELB; a connection point formed by the first comparator COMP1 and an OR gate circuit is referred to as an OCP1; and a connection point formed by the second comparator COMP2 and the OR gate circuit is referred to as an OCP2.

The working principle of an enable circuit 24 is described as follows: when $$V_{out} < V_{ref3} \cdot \frac{R_4 + R_5 + R_6}{R_6},$$

the first switch SW1 is disconnected, such that the third comparator COMP3 outputs a high voltage signal, whereas the inverter INV outputs a low voltage signal, that is, the voltage of the point SEL is a high voltage, the voltage of the point SELB is 0, and the high voltage signal output by the third comparator COMP3 enables the second comparator COMP2, such that the second comparator COMP2 works; in this case, the low voltage signal output by the inverter INV cannot enable the first comparator COMP1, and thus the first comparator COMP1 does not work, that is, the second overcurrent detection sub-circuit 22 works, whereas the first overcurrent detection sub-circuit 21 does not work.

When $$V_{out} \geq V_{ref3} \cdot \frac{R_4 + R_5 + R_6}{R_6},$$

the first switch SW1 is conducted, such that the third comparator COMP3 outputs a low voltage signal, whereas the inverter INV outputs a high voltage signal, that is, the voltage of the point SEL is 0, the voltage of the point SELB is a high voltage, and the high voltage signal output by the inverter INV enables the first comparator COWL such that the first comparator COMP1 works; in this case, the low voltage signal output by the third comparator COMP3 cannot enable the second comparator COMP2, and thus the second comparator COMP2 does not work, that is, the first overcurrent detection sub-circuit 21 works whereas second overcurrent detection sub-circuit 22 does not work; since the first switch SW1 is conducted, only when $$V_{out} < V_{ref3} \cdot \frac{R_4 + R_6}{R_6},$$

the first switch SW1 is disconnected, the third comparator COMP3 can output high voltage signal whereas the inverter INV can output a low voltage signal.

Herein, whether the fifth resistor R5 is short circuited is controlled by using a connection and disconnection of the first switch SW1, and then a detection point of the voltage of the voltage output terminal VOUT is changed; that is, the effects of the first switch SW1, the fourth resistor R4, the fifth resistor R5, and the sixth resistor R6 are to implement the delay function. The high voltage signal refers to an output signal of the third comparator COMP3 when it is indicated that $$V_{out} < V_{ref3} \cdot \frac{R_4 + R_5 + R_6}{R_6};$$

the low voltage signal refers to an output signal of the third comparator COMP3 when it is indicated that $$V_{out} \geq V_{ref3} \cdot \frac{R_4 + R_5 + R_6}{R_6};$$

and for example, assume that the output signal of the third comparator COMP3 comprises two types of signals 0 and 1, 1 is the high voltage signal, and 0 is the low voltage signal.

The working principle of the first overcurrent detection sub-circuit 21 is described as follows: when $I_1 < V_{ref1}/R_1 \cdot K$, the third switch SW3 is conducted, and the fourth switch SW4 is disconnected, such that the first comparator COMP1 outputs a low voltage signal, that is, the voltage of the point OCP1 is 0; when $I_1$ gradually increases, and $I_1 \geq V_{ref2}/R_1 \cdot K$, the fourth switch SW4 is conducted, and the third switch SW3 is disconnected, such that the first comparator COMP1 outputs a high voltage signal, that is, the voltage of the point OCP1 is a high voltage; in this case, it is indicated that the current flowing through the first NMOSFET MN1 and the second NMOSFET MN2 is great, and an overcurrent is present, specifically, the first overcurrent detection sub-circuit 21 detects that the overcurrent of the first NMOSFET MN1 and the second NMOSFET MN2; only when $I_1$ gradually reduces, and $I_1 \leq V_{ref1}/R_1 \cdot K$, the third switch SW3 is conducted again, and the fourth switch SW4 is disconnected again, such that the first comparator COMP1 re-outputs a low voltage signal; as such the delay may be effectively implemented and accuracy in detection may be ensured; wherein $I_1$ indicates the current flowing through the first NMOSFET MN1 and the second NMOSFET MN2, K indicates the current mirror ratio, and $V_{ref1} < V_{ref2}$. Herein, the high voltage signal refers to an output signal of the first comparator COMP1 when it is indicated that $I_1 \geq V_{ref2}/R_1 \cdot K$; the low voltage signal refers to an output signal of the first comparator COMP1 when it is indicated that $I_1 < V_{ref2}/R_1 \cdot K$; and for example, assume that the output signal of the first comparator COMP1 comprises two types of signals 0 and 1, 1 is the high voltage signal, and 0 is the low voltage signal.

The working principle of the second overcurrent detection sub-circuit 22 is described as follows: when $V_A < V_D$, the second switch SW2 is disconnected; since $V_A = V_{out} + I_1 \cdot Rdson_{MN2}$ and $V_D = V_{out} + I_3 \cdot (R_2 + R_3)$, when $I_1 \cdot Rdson_{MN2} < I_3 \cdot (R_2 + R_3)$, the second comparator COMP2 outputs a low voltage signal, that is, the voltage of the point OCP2 is 0; when $V_A \geq V_D$, the second switch SW2 is conducted, that is, when $I_1 \cdot Rdson_{MN2} \geq I_3 \cdot (R_2 + R_3)$, the third resistor R3 is short circuited, and the second comparator COMP2 outputs a high voltage signal, that is, the voltage of the point OCP2 is a high voltage; in this case, it is indicated that the current flowing through the first NMOSFET MN1 and the second NMOSFET MN2 is too great, and an overcurrent is present; in other words, the second overcurrent detection sub-circuit 22 detects that the overcurrent of the first NMOSFET MN1 and the second NMOSFET MN2; only when $V_D$ is reduced, and $I_1 \cdot Rdson_{MN2} \leq I_3 \cdot R_2$, the second switch SW2 is disconnected again, and the voltage of the point OCP2 changes again from a high voltage to a low voltage; in this way, delay may be effectively implemented and accuracy in detection may be ensured. $I_1$ indicates the current flowing through the first NMOSFET MN1 and the second NMOSFET MN2, $Rdson_{MN2}$ indicates a conduction resistance of the second NMOSFET MN2, and $I_3$ indicates the current output by the reference current source $I_0$.

Herein, since during conduction of the second NMOSFET MN2, $Rdson_{MN2}$ is a resistance gradually changing from a great value to a small value, and in addition, since $I_1$ gradually changes from a small value to a great value, a voltage drop at two terminals of the drain of the second NMOSFET MN2 is an ever-changing value, and gradually increases with the increase of the voltage of the gate of the second NMOSFET MN2; therefore, in practical application, a maximum voltage value $V_{max}$ needs to be obtained via a simulation experiment during normal power-on of the voltage output connection point, and $I_3 \cdot (R_2 + R_3)$ needs to be greater than $V_{max}$; as such, it may be ensured that during normal power-on of the voltage output connection point of the second comparator COMP2, no high voltage signal is mistakenly output; in other words, it may be ensured that the second overcurrent detection sub-circuit 22 may not be subjected to false detection during normal power-on of the voltage output connection point; in addition, the value of $I_3 \cdot (R_2 + R_3)$ shall not be too great, and only in this way, it may be ensured that the first overcurrent detection sub-circuit 21 and the second overcurrent detection sub-circuit 22 orderly work, such that the effect of overcurrent protection is practically achieved.

Herein, the high voltage signal refers to an output signal of the second comparator COMP2 when it is indicated that $V_A \geq V_D$; the low voltage signal refers to an output signal of the second comparator COMP2 when it is indicated that $V_A<V_D$; and for example, assume that the output signal of the second comparator COMP2 comprises two types of signals 0 and 1, 1 is the high voltage signal, and 0 is the low voltage signal.

The working principle of the overcurrent protection circuit 25 is described as follows: after the OR gate circuit receives a high voltage signal output by the first comparator COMP1 or a high voltage signal output by the second comparator COMP2, the high voltage signal is input to the logic control circuit; upon receiving the high voltage signal, the logic control circuit stops outputting an enable signal to the charge pump, such that the charge pump is turned off; after the charge pump is turned off, the first NMOSFET MN1 and the second NMOSFET MN2 are disabled, such that the effect of overcurrent protection is achieved.

It shall be noted that: when the overcurrent detection circuit as illustrated in FIG. 6 is employed, if the first overcurrent detection sub-circuit 21 is singly used, that is, only when the VOUT voltage value is low or close to the GND, $V_A$ is equal to $V_{out}$ whereas the voltage of point B is equal to $I_2 \times R_1$; therefore, the voltage of point A is not equal to the voltage of point B, and thus an error of the current mirror ratio K is extremely great; as a result, when $I_1$ is extremely great, $I_2 \times R_1$ is still less than $V_{ref2}$, and thus the first NMOSFET MN1 and the second NMOSFET MN2 are damaged due to a great current; however, after the second overcurrent detection sub-circuit 22 works, the problem that detection of the current flowing through the switch circuit 23 is not accurate when $V_{out}$ is very low. However, in practical application, it shall be noted that a suitable voltage threshold needs to be defined for the path on which the first overcurrent detection sub-circuit 21 and the second overcurrent detection sub-circuit 22 work; if a too small threshold is defined, when $V_{out}$ is low but still greater than the defined threshold, since the first overcurrent detection sub-circuit 21 performs overcurrent detection for the switch circuit 23, the current mirror may not be accurate, and thus the switch circuit 23 may tend to be damaged; if a too great threshold is defined, when $V_{out}$ is high but still less than the defined threshold, since the second overcurrent detection sub-circuit 22 performs overcurrent detection for the switch circuit 23, the value of $V_D$ may be very close to the voltage of the voltage input node VIN, and thus $I_3$ changes smaller and accordingly the value of $I_3 \cdot (R_2+R_3)$ changes smaller; in this way, mistaken triggering of the overcurrent protection may tend to occur, that is, $V_A > V_D$; as a result, the second comparator COMP2 outputs a high voltage signal, which mistakenly triggers the overcurrent protection, such that the first NMOSFET MN1 and the second NMOSFET MN2 are disabled, and thus the corresponding chips fail to properly work. $I_2$ indicates the current flowing through the fourth NMOSFET MN4.

In practical application, the load switch may be an RCB load switch.

FIG. 7 is a simulation diagram illustrating various sub-circuits according to the technical solutions provided in the embodiments of the present invention. As seen from FIG. 7:

In state 1, that is, the power-on stage of the voltage output node VOUT, the voltage output node VOUT is short circuited to the ground, and the third comparator COMP3 outputs a high voltage signal; therefore, the second overcurrent detection sub-circuit 22 works whereas the first overcurrent detection sub-circuit 21 does not work; in other words, the first comparator COMP1 outputs a low voltage signal, that is, the voltage of the point OCP1 is 0; in this state, the voltage output by the charge pump is gradually increased, and in this case, the current $I_1$ flowing through the first NMOSFET MN1 and the second NMOSFET MN2 is less than or equal to a preset value; therefore, the second comparator COMP2 outputs a low voltage signal, that is, the voltage of the point OCP2 is 0, and thus the voltage of the output terminal OCP of the OR gate circuit is also 0.

In state 2, the voltage output node VOUT is still short circuited to the ground, and the third comparator COMP3 outputs a high voltage signal; therefore, the second overcurrent detection sub-circuit 22 works whereas the first overcurrent detection sub-circuit 21 does not work; in other words, the first comparator COMP1 outputs a low voltage signal, that is, the voltage of the point OCP1 is 0; in this state, the voltage output by the charge pump is still gradually increased, and with the further increase of the voltage output by the charge pump, the current $I_1$ flowing through the first NMOSFET MN1 and the second NMOSFET MN2 is greater than a preset value; therefore, the second comparator COMP2 outputs a high voltage signal, that is, the voltage of the point OCP2 is a high voltage, and thus the voltage of the output terminal OCP of the OR gate circuit is also a high voltage.

In state 3, that is, the voltage output node VOUT has been normally powered on, $$V_{out} > V_{ref3} \cdot \frac{R_4 + R_5 + R_6}{R_6},$$

and therefore, the third comparator COMP3 outputs a low voltage signal, and the first overcurrent detection sub-circuit 21 works whereas the second overcurrent detection sub-circuit 22 does not work; in other words, the second comparator COMP2 outputs a low voltage signal, that is, the voltage of the point OCP2 is 0; in this state, the voltage output by the charge pump is still gradually increased, when the current $I_1$ flowing through the first NMOSFET MN1 and the second NMOSFET MN2 is less than or equal to the preset value $V_{ref2}/R_1 \cdot K$, the first comparator COMP1 outputs a low voltage signal, that is, the voltage of the point OCP2 is 0, and thus the voltage of the output terminal OCP of the OR gate circuit is also 0; when the current $I_1$ flowing through the first NMOSFET MN1 and the second NMOSFET MN2 is greater than the preset value $V_{ref2}/R_1 \cdot K$, the first comparator outputs a high voltage signal, that is, the voltage of the point OCP1 is a high voltage, and thus the voltage output by the output terminal OCP of the OR gate circuit is also a high voltage.

In state 4, the voltage output node VOUT has still been normally powered on; in this case, $$V_{out} > V_{ref3} \cdot \frac{R_4 + R_5 + R_6}{R_6},$$

and therefore the third comparator COMP3 outputs a low voltage signal, and the first overcurrent detection sub-circuit 21 works whereas the second overcurrent detection sub-circuit 22 does not work; in other words, the second comparator COMP2 outputs a low voltage signal, that is, the voltage of the point OCP2 is 0; in this state, the charge pump is turned off, and when the current flowing through the first NMOSFET MN1 and the second NMOSFET MN2 starts to decrease and when the current $I_1$ flowing through the first NMOSFET MN1 and the second NMOSFET MN2 decreases to be less than or equal to $V_{ref1}/R_1 \cdot K$, the first comparator COMP1 outputs a low voltage signal, that is, the voltage of the point OCP1 is 0, and thus the voltage output by the output terminal OCP of the OR gate circuit is also 0.

As seen from the above description, with the technical solutions provided in the embodiments of the present invention, overcurrents present during the process from start-up of power-on to normal power-on and working may be effectively detected.

Based on the above load switch, an embodiment of the present invention further provides a portable device, wherein the portable device comprises a load switch. The load switch comprises an overcurrent protection circuit. As illustrated in FIG. 2, the overcurrent protection circuit comprises: a first overcurrent detection sub-circuit 21 and a second overcurrent detection sub-circuit 22; wherein:

the first overcurrent detection sub-circuit 21 performs overcurrent detection for a switch circuit 23 when a voltage of an output terminal of the switch circuit 23 is greater than or equal to a preset threshold; and the second overcurrent detection sub-circuit 22 performs overcurrent detection for the switch circuit 23 when the voltage of the output terminal of the switch circuit 23 is less than the preset threshold.

Herein, in practical application, the overcurrent detection circuit provided in the embodiment of the present invention may be applicable to an application scenario where the switch circuit 23 is in a conduction state. The switch circuit 23 being in a conduction state refers to that the switch circuit 23 is subjected to a current therethrough.

The threshold may be defined according to needs of a designed circuit.

The switch circuit 23 may be implemented by using a MOSFET, and more particularly, may be implemented by using an NMOSFET or a PMOSFET. In practical application, in consideration of costs, in consideration of costs, the switch circuit 23 is generally implemented by using an NMOSFET.

As illustrated in FIG. 3, the overcurrent detection circuit may further comprise an enable circuit 24. The enable circuit 24 inputs an enable signal to the first overcurrent detection sub-circuit 21 when the voltage of the output terminal of the switch circuit 23 is greater than or equal to the preset threshold, and correspondingly, the first overcurrent detection sub-circuit 21 performs overcurrent detection for the switch circuit 23 upon receiving the enable signal input by the enable circuit 24. The enable circuit 24 inputs an enable signal to the second overcurrent detection sub-circuit 22 when the voltage of the output terminal of the switch circuit 23 is less than the preset threshold, and the second overcurrent detection sub-circuit 22 performs overcurrent detection for the switch circuit 23 upon receiving the enable signal input by the enable circuit 24.

As shown in FIGS. 4 and 5, the overcurrent detection circuit may further comprise an overcurrent protection circuit 25. The first overcurrent detection sub-circuit 21 or the second overcurrent detection sub-circuit 22 sends an overcurrent result of the switch circuit 23 to the overcurrent protection circuit 25 when the first overcurrent detection sub-circuit 21 or the second overcurrent detection sub-circuit 22 detects that the switch circuit 23 is subjected to an overcurrent. The overcurrent protection circuit 25 enables the switch circuit 23 to stay in an OFF state upon receiving the overcurrent result of the switch circuit 23 sent by the first overcurrent detection sub-circuit 21 or the second overcurrent detection sub-circuit 22. In this way, the switch circuit 23 may be effectively protected from damage, such that the switch circuit 23 can be protected. Herein, detecting that the switch circuit 23 being subjected to an overcurrent refers to that the current flowing through the switch circuit 23 is greater than a preset current threshold; the switch circuit 23 being in an OFF state refers to that no current flows through the switch circuit 23.

FIG. 6 is a schematic structural diagram of an application example of an overcurrent detection circuit according to an embodiment of the present invention. As illustrated in FIG. 6, the switch circuit 23 comprises: a first NMOSFET MN1 and a second NMOSFET MN2; the first overcurrent detection sub-circuit 21 comprises: a third NMOSFET MN3, an operational amplifier (OP), a fourth NMOSFET MN4, a first resistor R1, a third switch SW3, a fourth switch SW4, and a first comparator (COMP1); the second overcurrent detection sub-circuit 22 comprises: a reference current source $I_O$, a second resistor R2, a third resistor R3, a second switch SW2, and a second comparator (COMP2); the enable circuit 24 comprises: a first switch SW1, a fourth resistor R4, a fifth resistor R5, a sixth resistor R6, a third comparator (COMP3), and an inverter INV; and the overcurrent protection circuit 25 comprises: an OR gate circuit, a logic control circuit, and a charge pump; wherein the first switch SW1, the second switch SW2, the third switch SW3, a fourth switch SW4 are all single-pole single-throw switches, and the third switch SW3 and the fourth switch SW4 form a single-pole double-throw switch.

The coupling relationship among components of the overcurrent detection circuit as illustrated shown in FIG. 6 is as follows:

in the switch circuit 23, a gate of the first NMOSFET MN1 is connected to the charge pump of the overcurrent protection circuit 25; a drain of the first NMOSFET MN1 is connected to a voltage input node VIN; a source of the first NMOSFET MN1 is connected to a source of the second NMOSFET MN2, an inverting input terminal of the operational amplifier OP, and a positive input terminal of the second comparator COMP2 of the second overcurrent detection sub-circuit 22; a gate of the second NMOSFET MN2 is connected to the charge pump of the overcurrent protection circuit 25; and a drain of the second NMOSFET MN2 is connected to a voltage output node VOUT, one terminal of the second resistor R2 of the second overcurrent detection sub-circuit 22, and one terminal of the fourth resistor R4 of the enable circuit 24;

in the first overcurrent detection sub-circuit 21, a gate of the third NMOSFET MN3 is connected to the charge pump of the overcurrent protection circuit 25; a drain of the third NMOSFET MN3 is connected to the voltage input node VIN; a source of the third NMOSFET MN3 is connected to a non-inverting input terminal of the operational amplifier OP and a drain of the fourth NMOSFET MN4; an output terminal of the operational amplifier OP is connected to a gate of the fourth NMOSFET MN4; a source of the fourth NMOSFET MN4 is connected to one terminal of the first resistor R1 and a positive input terminal of the first comparator COMP1; the other terminal of the first resistor R1 is grounded; a negative input terminal of the first comparator COMP1 is connected to one terminal of the third switch SW3 and one terminal of the fourth switch SW4; the other terminal of the third switch SW3 is connected to a node outputting a first reference voltage; the other terminal of the fourth switch SW4 is connected to a node outputting a second reference voltage; and an output terminal of the first comparator COMP1 is connected to a first input terminal of the OR gate circuit of the overcurrent protection circuit 25;

in the second overcurrent detection sub-circuit 22, the other terminal of the second resistor R2 is connected to one terminal of the third resistor R3 and a first terminal of the second switch SW2; the other terminal of the third resistor R3 is connected to a second terminal of the second switch SW2, one terminal of the reference current source $I_0$, and a negative input terminal of the second comparator COMP2; the other terminal of the reference current source $I_0$ is connected to the voltage input node VIN; and an output terminal of the second comparator COMP2 is connected to a third terminal of the second switch SW2 and a second input terminal of the OR gate circuit of the overcurrent protection circuit 25;

in the enable circuit 24, the other terminal of the fourth resistor R4 is connected to one terminal of the fifth resistor R5 and a first terminal of the first switch SW1; the other terminal of the fifth resistor R5 is connected to a second terminal of the first switch SW1, one terminal of the sixth resistor R6, and a negative input terminal of the third comparator COMP3; the other terminal of the sixth resistor R6 is grounded; a positive input terminal of the third comparator COMP3 is connected to a node outputting a third reference voltage; an output terminal of the third comparator COMP3 is connected to a third terminal of the first switch SW1, an enable input terminal of the second comparator COMP2, and an input terminal of the inverter INV; and an output terminal of the inverter INV is connected to an enable input terminal of the first comparator COMP1; and in the overcurrent protection circuit 25, an output terminal of the OR gate circuit is connected to an input terminal of the logic control circuit; and an output terminal of the logic control circuit is connected to an enable input terminal of the charge pump.

The following specifically describes the working principle of an overcurrent detection circuit as illustrated in FIG. 6.

For ease of description, in the following description, a voltage of a voltage output contact is referred to as $V_{out}$, a first reference voltage is referred to as $V_{ref1}$, a second reference voltage is referred to as $V_{ref2}$, and a third reference voltage is referred to as $V_{ref3}$; a resistance of first resistor R1 is referred to as $R_1$, a resistance of second resistor R2 is referred to as $R_2$, a resistance of third resistor R3 is referred to as $R_3$, a resistance of fourth resistor R4 is referred to as $R_4$, a resistance of fifth resistor R5 is referred to as $R_5$, and a resistance of sixth resistor R6 is referred to as $R_6$; a connection point formed by a first NMOSFET MN1, a second NMOSFET MN2 and an operational amplifier OP is referred to as a point A, and the corresponding voltage is referred to as $V_A$; a connection point formed by a third NMOS MN3, an operational amplifier OP, and a fourth NMOSFET MN4 is referred to as a point B; a connection point formed by a fourth NMOSFET MN4, the first resistor R1, and a first comparator COMP1 is referred to as a point C; a connection point formed by a reference current source, the third resistor R3, and a second comparator COMP2 is referred to as a point D, and the corresponding voltage is referred to as $V_D$; a connection point formed by the second comparator COMP2, a third comparator COMP3, and an inverter INV is referred to as SEL; a connection point formed by the inverter INV and the first comparator COMP1 is referred to as SELB; a connection point formed by the first comparator COMP1 and an OR gate circuit is referred to as an OCP1; and a connection point formed by the second comparator COMP2 and the OR gate circuit is referred to as an OCP2.

The working principle of an enable circuit 24 is described as follows: when $$V_{out} < V_{ref3} \cdot \frac{R_4 + R_5 + R_6}{R_6},$$

the first switch SW1 is disconnected, such that the third comparator COMP3 outputs a high voltage signal, whereas the inverter INV outputs a low voltage signal, that is, the voltage of the point SEL is a high voltage, the voltage of the point SELB is 0, and the high voltage signal output by the third comparator COMP3 enables the second comparator COMP2, such that the second comparator COMP2 works; in this case, the low voltage signal output by the inverter INV cannot enable the first comparator COMP1, and thus the first comparator COMP1 does not work, that is, the second overcurrent detection sub-circuit 22 works, whereas the first overcurrent detection sub-circuit 21 does not work.

When $$V_{out} \geq V_{ref3} \cdot \frac{R_4 + R_5 + R_6}{R_6},$$

the first switch SW1 is conducted, such that the third comparator COMP3 outputs a low voltage signal, whereas the inverter INV outputs a high voltage signal, that is, the voltage of the point SEL is 0, the voltage of the point SELB is a high voltage, and the high voltage signal output by the inverter INV enables the first comparator COMP1, such that the first comparator COMP1 works; in this case, the low voltage signal output by the third comparator COMP3 cannot enable the second comparator COMP2, and thus the second comparator COMP2 does not work, that is, the first overcurrent detection sub-circuit 21 works whereas second overcurrent detection sub-circuit 22 does not work; since the first switch SW1 is conducted, only when $$V_{out} < V_{ref3} \cdot \frac{R_4 + R_6}{R_6},$$

the first switch SW1 is disconnected, the third comparator COMP3 can output high voltage signal whereas the inverter INV can output a low voltage signal.

Herein, whether the fifth resistor R5 is short circuited is controlled by using a connection and disconnection of the first switch SW1, and then a detection point of the voltage of the voltage output terminal VOUT is changed; that is, the effects of the first switch SW1, the fourth resistor R4, the fifth resistor R5, and the sixth resistor R6 are to implement the delay function. The high voltage signal refers to an output signal of the third comparator COMP3 when it is indicated that $$V_{out} < V_{ref3} \cdot \frac{R_4 + R_5 + R_6}{R_6};$$

the low voltage signal refers to an output signal of the third comparator COMP3 when it is indicated that $$V_{out} \geq V_{ref3} \cdot \frac{R_4 + R_5 + R_6}{R_6};$$

and for example, assume that the output signal of the third comparator COMP3 comprises two types of signals 0 and 1, 1 is the high voltage signal, and 0 is the low voltage signal.

The working principle of the first overcurrent detection sub-circuit 21 is described as follows: when $I_1<V_{ref1}/R_1\cdot K$, the third switch SW3 is conducted, and the fourth switch SW4 is disconnected, such that the first comparator COMP1 outputs a low voltage signal, that is, the voltage of the point OCP1 is 0; when $I_1$ gradually increases, and $I_1>V_{ref2}/R_1\cdot K$, the fourth switch SW4 is conducted, and the third switch SW3 is disconnected, such that the first comparator COMP1 outputs a high voltage signal, that is, the voltage of the point OCP1 is a high voltage; in this case, it is indicated that the current flowing through the first NMOSFET MN1 and the second NMOSFET MN2 is great, and an overcurrent is present, specifically, the first overcurrent detection sub-circuit 21 detects that the overcurrent of the first NMOSFET MN1 and the second NMOSFET MN2; only when $I_1$ gradually reduces, and $I_1 \leq V_{ref1}/R_1\cdot K$, the third switch SW3 is conducted again, and the fourth switch SW4 is disconnected again, such that the first comparator COMP1 re-outputs a low voltage signal; as such the delay may be effectively implemented and accuracy in detection may be ensured; wherein $I_1$ indicates the current flowing through the first NMOSFET MN1 and the second NMOSFET MN2, K indicates the current mirror ratio, and $V_{ref1}<V_{ref2}$. Herein, the high voltage signal refers to an output signal of the first comparator COMP1 when it is indicated that $I_1 \geq V_{ref2}/R_1\cdot K$; the low voltage signal refers to an output signal of the first comparator COMP1 when it is indicated that $I_1<V_{ref2}/R_1\cdot K$; and for example, assume that the output signal of the first comparator COMP1 comprises two types of signals 0 and 1, 1 is the high voltage signal, and 0 is the low voltage signal.

The working principle of the second overcurrent detection sub-circuit 22 is described as follows: when $V_A<V_D$, the second switch SW2 is disconnected; since $V_A=V_{out}+I_1\cdot Rdson_{MN2}$ and $V_D=V_{out}+I_3\cdot(R_2+R_3)$, when $I_1\cdot Rdson_{MN2}<I_3\cdot(R_2+R_3)$, the second comparator COMP2 outputs a low voltage signal, that is, the voltage of the point OCP2 is 0; when $V_A \geq V_D$, the second switch SW2 is conducted, that is, when $I_1\cdot Rdson_{MN2}>I_3\cdot(R_2+R_3)$, the third resistor R3 is short circuited, and the second comparator COMP2 outputs a high voltage signal, that is, the voltage of the point OCP2 is a high voltage; in this case, it is indicated that the current flowing through the first NMOSFET MN1 and the second NMOSFET MN2 is too great, and an overcurrent is present; in other words, the second overcurrent detection sub-circuit 22 detects that the overcurrent of the first NMOSFET MN1 and the second NMOSFET MN2; only when $V_D$ is reduced, and $I_1\cdot Rdson_{MN2} \leq I_3\cdot R_2$, the second switch SW2 is disconnected again, and the voltage of the point OCP2 changes again from a high voltage to a low voltage; in this way, delay may be effectively implemented and accuracy in detection may be ensured. $I_1$ indicates the current flowing through the first NMOSFET MN1 and the second NMOSFET MN2, $Rdson_{MN2}$ indicates a conduction resistance of the second NMOSFET MN2, and $I_3$ indicates the current output by the reference current source $I_0$.

Herein, since during conduction of the second NMOSFET MN2, $Rdson_{MN2}$ is a resistance gradually changing from a great value to a small value, and in addition, since $I_1$ gradually changes from a small value to a great value, a voltage drop at two terminals of the drain of the second NMOSFET MN2 is an ever-changing value, and gradually increases with the increase of the voltage of the gate of the second NMOSFET MN2; therefore, in practical application, a maximum voltage value $V_{max}$ needs to be obtained via a simulation experiment during normal power-on of the voltage output connection point, and $I_3\cdot(R_2+R_3)$ needs to be greater than $V_{max}$; as such, it may be ensured that during normal power-on of the voltage output connection point of the second comparator COMP2, no high voltage signal is mistakenly output; in other words, it may be ensured that the second overcurrent detection sub-circuit 22 may not be subjected to false detection during normal power-on of the voltage output connection point; in addition, the value of $I_3\cdot(R_2+R_3)$ shall not be too great, and only in this way, it may be ensured that the first overcurrent detection sub-circuit 21 and the second overcurrent detection sub-circuit 22 orderly work, such that the effect of overcurrent protection is practically achieved.

Herein, the high voltage signal refers to an output signal of the second comparator COMP2 when it is indicated that $V_A \geq V_D$; the low voltage signal refers to an output signal of the second comparator COMP2 when it is indicated that $V_A<V_D$; and for example, assume that the output signal of the second comparator COMP2 comprises two types of signals 0 and 1, 1 is the high voltage signal, and 0 is the low voltage signal.

The working principle of the overcurrent protection circuit 25 is described as follows: after the OR gate circuit receives a high voltage signal output by the first comparator COMP1 or a high voltage signal output by the second comparator COMP2, the high voltage signal is input to the logic control circuit; upon receiving the high voltage signal, the logic control circuit stops outputting an enable signal to the charge pump, such that the charge pump is turned off; after the charge pump is turned off, the first NMOSFET MN1 and the second NMOSFET MN2 are disabled, such that the effect of overcurrent protection is achieved.

It shall be noted that: when the overcurrent detection circuit as illustrated in FIG. 6 is employed, if the first overcurrent detection sub-circuit 21 is singly used, that is, only when the VOUT voltage value is low or close to the GND, $V_A$ is equal to $V_{out}$ whereas the voltage of point B is equal to $I_2 \times R_1$; therefore, the voltage of point A is not equal to the voltage of point B, and thus an error of the current mirror ratio K is extremely great; as a result, when $I_1$ is extremely great, $I_2 \times R_1$ is still less than $V_{ref2}$, and thus the first NMOSFET MN1 and the second NMOSFET MN2 are damaged due to a great current; however, after the second overcurrent detection sub-circuit 22 works, the problem that detection of the current flowing through the switch circuit 23 is not accurate when $V_{out}$ is very low. However, in practical application, it shall be noted that a suitable voltage threshold needs to be defined for the path on which the first overcurrent detection sub-circuit 21 and the second overcurrent detection sub-circuit 22 work; if a too small threshold is defined, when $V_{out}$ is low but still greater than the defined threshold, since the first overcurrent detection sub-circuit 21 performs overcurrent detection for the switch circuit 23, the current mirror may not be accurate, and thus the switch circuit 23 may tend to be damaged; if a too great threshold is defined, when $V_{out}$ is high but still less than the defined threshold, since the second overcurrent detection sub-circuit 22 performs overcurrent detection for the switch circuit 23, the value of $V_D$ may be very close to the voltage of the voltage input node VIN, and thus $I_3$ changes smaller and accordingly the value of $I_3\cdot(R_2+R_3)$ changes smaller; in this way, mistaken triggering of the overcurrent protection may tend to occur, that is, $V_A>V_D$; as a result, the second comparator COMP2 outputs a high voltage signal, which mistakenly triggers the overcurrent protection, such that the first NMOSFET MN1 and the second NMOSFET MN2 are disabled, and thus the corresponding chips fail to properly work. $I_2$ indicates the current flowing through the fourth NMOSFET MN4.

In practical application, the load switch may be an RCB load switch; and the portable device further includes: a housing, a CPU, and the like.

FIG. 7 is a simulation diagram illustrating various sub-circuits according to the technical solutions provided in the embodiments of the present invention. As seen from FIG. 7:

In state 1, that is, the power-on stage of the voltage output node VOUT, the voltage output node VOUT is short circuited to the ground, and the third comparator COMP3 outputs a high voltage signal; therefore, the second over-current detection sub-circuit 22 works whereas the first overcurrent detection sub-circuit 21 does not work; in other words, the first comparator COMP1 outputs a low voltage signal, that is, the voltage of the point OCP1 is 0; in this state, the voltage output by the charge pump is gradually increased, and in this case, the current $I_1$ flowing through the first NMOSFET MN1 and the second NMOSFET MN2 is less than or equal to a preset value; therefore, the second comparator COMP2 outputs a low voltage signal, that is, the voltage of the point OCP2 is 0, and thus the voltage of the output terminal OCP of the OR gate circuit is also 0.

In state 2, the voltage output node VOUT is still short circuited to the ground, and the third comparator COMP3 outputs a high voltage signal; therefore, the second over-current detection sub-circuit 22 works whereas the first overcurrent detection sub-circuit 21 does not work; in other words, the first comparator COMP1 outputs a low voltage signal, that is, the voltage of the point OCP1 is 0; in this state, the voltage output by the charge pump is still gradually increased, and with the further increase of the voltage output by the charge pump, the current $I_1$ flowing through the first NMOSFET MN1 and the second NMOSFET MN2 is greater than a preset value; therefore, the second comparator COMP2 outputs a high voltage signal, that is, the voltage of the point OCP2 is a high voltage, and thus the voltage of the output terminal OCP of the OR gate circuit is also a high voltage.

In state 3, that is, the voltage output node VOUT has been normally powered on, $$V_{out} > V_{ref3} \cdot \frac{R_4 + R_5 + R_6}{R_6},$$

and therefore, the third comparator COMP3 outputs a low voltage signal, and the first overcurrent detection sub-circuit 21 works whereas the second overcurrent detection sub-circuit 22 does not work; in other words, the second comparator COMP2 outputs a low voltage signal, that is, the voltage of the point OCP2 is 0; in this state, the voltage output by the charge pump is still gradually increased, when the current $I_1$ flowing through the first NMOSFET MN1 and the second NMOSFET MN2 is less than or equal to the preset value $V_{ref2}/R_1 \cdot K$, the first comparator COMP1 outputs a low voltage signal, that is, the voltage of the point OCP2 is 0, and thus the voltage of the output terminal OCP of the OR gate circuit is also 0; when the current $I_1$ flowing through the first NMOSFET MN1 and the second NMOSFET MN2 is greater than the preset value $V_{ref2}/R_1 \cdot K$, the first comparator outputs a high voltage signal, that is, the voltage of the point OCP1 is a high voltage, and thus the voltage output by the output terminal OCP of the OR gate circuit is also a high voltage.

In state 4, the voltage output node VOUT has still been normally powered on; in this case, $$V_{out} > V_{ref3} \cdot \frac{R_4 + R_5 + R_6}{R_6},$$

and therefore the third comparator COMP3 outputs a low voltage signal, and the first overcurrent detection sub-circuit 21 works whereas the second overcurrent detection sub-circuit 22 does not work; in other words, the second comparator COMP2 outputs a low voltage signal, that is, the voltage of the point OCP2 is 0; in this state, the charge pump is turned off, and when the current $I_1$ flowing through the first NMOSFET MN1 and the second NMOSFET MN2 starts to decrease and when the current $I_1$ flowing through the first NMOSFET MN1 and the second NMOSFET MN2 decreases to be less than or equal to $V_{ref1}/R_1 \cdot K$, the first comparator COMP1 outputs a low voltage signal, that is, the voltage of the point OCP1 is 0, and thus the voltage output by the output terminal OCP of the OR gate circuit is also 0.

As seen from the above description, with the technical solutions provided in the embodiments of the present invention, overcurrents present during the process from start-up of power-on to normal power-on and working may be effectively detected.

Those skilled in the art shall understand that the embodiments may be described as illustrating methods, systems, or computer program products. Therefore, hardware embodiments, software embodiments, or hardware-plus-software embodiments may be used to illustrate the present invention. In addition, the present invention may further employ a computer program product which may be implemented by at least one non-transitory computer-readable storage medium with an executable program code stored thereon. The non-transitory computer-readable storage medium comprises but not limited to a disk memory and an optical memory.

The present invention is described based on the flowcharts and/or block diagrams of the method, device (system), and computer program product. It should be understood that each process and/or block in the flowcharts and/or block diagrams, and any combination of the processes and/or blocks in the flowcharts and/or block diagrams may be implemented using computer program instructions. These computer program instructions may be issued to a computer, a dedicated computer, an embedded processor, or processors of other programmable data processing device to generate a machine, which enables the computer or the processors of other programmable data processing devices to execute the instructions to implement an apparatus for implementing specific functions in at least one process in the flowcharts and/or at least one block in the block diagrams.

These computer program instructions may also be stored a non-transitory computer-readable memory capable of causing a computer or other programmable data processing devices to work in a specific mode, such that the instructions stored on the non-transitory computer-readable memory implement a product comprising an instruction apparatus, wherein the instruction apparatus implements specific functions in at least one process in the flowcharts and/or at least one block in the block diagrams.

These computer program instructions may also be stored on a computer or other programmable data processing devices, such that the computer or the other programmable data processing devices execute a series of operations or steps to implement processing of the computer. In this way, the instructions, when executed on the computer or the other programmable data processing devices, implement the specific functions in at least one process in the flowcharts and/or at least one block in the block diagrams.

The above embodiments are merely preferred embodiments of the present invention, but are not intended to limit the protection scope of the present invention.

What is claimed is:

1. An overcurrent detection circuit, comprising:
   an enable circuit defining a first enable terminal and a second enable terminal, the second enable terminal distinct from the first enable terminal;
   a first overcurrent detection sub-circuit comprising:
      a current mirror circuit coupled to an input node of a circuit to be detected, the current mirror circuit configured to generate a mirror current proportional to a first current flowing through the circuit to be detected;
      a first comparator having a first input coupled to the current mirror circuit, a second input, an enable input coupled to the first enable terminal, and a first comparison output defining a first overcurrent protection terminal;
   a second overcurrent detection sub-circuit comprising:
      a second comparator having a first input coupled the second input of the first comparator, a second input, an enable input coupled to the second enable terminal, and a first comparison output defining a second overcurrent protection terminal; and
      a reference voltage generation circuit configured to generate and provide a first reference voltage to the second input of the second comparator;
      wherein the second comparator is distinct from the first comparator, and the second overcurrent protection terminal is distinct from the first overcurrent protection terminal;
   wherein the enable circuit is configured to compare a voltage at an output node of the circuit to be detected with a second reference voltage, to de-assert the second enable terminal and assert the first enable terminal when the voltage at the output node of the circuit to be detected is greater than the second reference voltage, and to de-assert the first enable terminal and assert the second enable terminal when the voltage at the output node of the circuit to be detected is not greater than the second reference voltage;
   wherein the first overcurrent detection sub-circuit is configured to perform overcurrent detection on the circuit to be detected in response to assertion of the first enable terminal; and
   wherein the second overcurrent detection sub-circuit is configured to perform overcurrent detection on the circuit to be detected in response to assertion of the second enable terminal, and the first and second overcurrent detection sub-circuits configured to assert their respective first and second overcurrent protection terminals to indicate overcurrent on the circuit to be detected.

2. The overcurrent detection circuit according to claim 1, further comprising a circuit configured to turn off the circuit to be detected in response to detecting assertion of the first or second overcurrent protection terminals.

3. The overcurrent detection circuit according to claim 1, wherein the circuit to be detected is a switch circuit comprising:
   the input node;
   the output node;
   a first N-channel metal oxide semiconductor (NMOS) switch with a drain coupled to the input node; and
   a second NMOS switch with a source coupled to a source of the first NMOS switch and a drain coupled to the output node.

4. The overcurrent detection circuit according to claim 3, wherein the second overcurrent detection sub-circuit is configured to compare a voltage at the source of the second NMOS switch with the first reference voltage, and to assert the second overcurrent protection terminal in response to the voltage at the source of the second NMOS switch being greater than the first reference voltage.

5. The overcurrent detection circuit according to claim 1, wherein the reference voltage generation circuit comprises:
   a reference current source coupled between the input node and the second input of the second comparator; and
   a resistor circuit coupled between the output node and the second input of the second comparator.

6. The overcurrent detection circuit according to claim 3, wherein the first overcurrent detection sub-circuit comprises:
   the second input of the first comparator configured to couple to a third reference voltage during periods of time when the first overcurrent protection terminal is de-asserted, and the second input of the first comparator configured to couple to a fourth reference voltage during periods of time when the first overcurrent protection terminal is asserted, the fourth reference voltage is different than the third reference voltage.

7. An overcurrent detection method, comprising:
   causing a first current to flow through a circuit to be detected;
   comparing a voltage at an output node of the circuit to be detected with a first reference voltage;
   performing overcurrent detection on the circuit to be detected using a first overcurrent detection sub-circuit when the voltage at the output node of the circuit to be detected is greater than the first reference voltage;
   asserting, by the first overcurrent detection sub-circuit, a first overcurrent indication terminal when the first overcurrent detection sub-circuit detects overcurrent in the circuit to be detected;
   performing overcurrent detection on the circuit to be detected using a second overcurrent detection sub-circuit when the voltage at the output node of the circuit to be detected is not greater than the first reference voltage, the second overcurrent detection sub-circuit is distinct from the first overcurrent detection sub-circuit; and
   asserting, by the second overcurrent detection sub-circuit, a second overcurrent indication terminal when the second overcurrent detection sub-circuit detects overcurrent in the circuit to be detected, the second overcurrent indication terminal is distinct from the first overcurrent indication terminal.

8. The overcurrent detection method according to claim 7, further comprising turning off the circuit to be detected in response to assertion of either the first overcurrent indication terminal or the second overcurrent indication terminal.

9. The overcurrent detection method according to claim 7, wherein performing overcurrent detection on the circuit to be detected using the second overcurrent detection sub-circuit comprises:
   generating a second reference voltage;
   comparing a voltage at a first node in the circuit to be detected with the second reference voltage, wherein the voltage at the first node is equal to a product of the first current and a resistance between the output node and the first node plus a voltage at the output node; and asserting the second overcurrent indication terminal in response to the voltage at the first node being greater than the second reference voltage.

10. The overcurrent detection method according to claim 7 wherein performing overcurrent detection on the circuit to be detected by using the first overcurrent detection sub-circuit comprises:

generating a second current proportional to the first current;

comparing a voltage correlated with the second current with a second reference voltage;

asserting the first overcurrent indication terminal in response to the voltage correlated with the second current being higher than the second reference voltage; and then de-asserting the first overcurrent indication terminal in response to the voltage correlated with the second current being lower than a third reference voltage.

11. A load switch, comprising:

a switch circuit comprising an input node and an output node;

a first overcurrent detection sub-circuit that is configured to perform overcurrent detection on the switch circuit in response to assertion of a first enable terminal, and to assert a first overcurrent indication terminal by way of a first comparator in response to detecting overcurrent in the switch circuit;

a second overcurrent detection sub-circuit that is configured to perform overcurrent detection on the switch circuit in response to assertion of a second enable terminal, and to assert a second overcurrent indication terminal by a second comparator in response to detecting overcurrent in the switch circuit, the second overcurrent detection sub-circuit distinct from the first overcurrent detection sub-circuit, the second overcurrent indication terminal distinct from the first overcurrent indication terminal, the first enable signal distinct from the second enable signal, and the first comparator distinct from the second comparator; and an enable circuit configured to compare a voltage at the output node of the switch circuit with a first reference voltage, to assert the first enable terminal when the voltage at the output node of the switch circuit is greater than or equal to the first reference voltage, and to assert the second enable terminal when the voltage at the output node of the switch circuit is not greater than or equal to the first reference voltage.

12. The load switch according to claim 11, wherein the switch circuit comprises:

a first N-channel metal oxide semiconductor (NMOS) switch with a drain coupled to the input node; and a second NMOS switch with a source coupled to a source of the first NMOS switch and a drain coupled to the output node, wherein the second comparator of the second overcurrent detection sub-circuit is configured to compare a voltage at the source of the second NMOS switch with a second reference voltage, and to assert the second overcurrent indication terminal in response to the voltage at the source of the second NMOS switch being greater than the second reference voltage.

13. The load switch according to claim 12, wherein the second overcurrent detection sub-circuit comprises:

the second comparator having a first input coupled to the source of the second NMOS switch, a second input, and a first comparison output defining the second overcurrent indication terminal; and a reference voltage generation circuit, configured to generate and provide the second reference voltage to the second input.

14. The load switch according to claim 13, wherein the reference voltage generation circuit comprises:

a reference current source coupled between the input node and the second input; and a resistor circuit coupled between the output node and the second input.

15. An electronic device, comprising a load switch comprising:

a switch circuit comprising an input node and an output node;

an enable circuit;

a first overcurrent detection sub-circuit defining a first overcurrent indication terminal, the first overcurrent detection sub-circuit coupled to the enable circuit; and a second overcurrent detection sub-circuit defining a second overcurrent indication terminal, the second overcurrent detection sub-circuit coupled to the enable circuit, and the second overcurrent detection sub-circuit and the second overcurrent indication terminal distinct from the first overcurrent detection sub-circuit and the first overcurrent indication terminal, respectively;

wherein the enable circuit is configured to compare a voltage at the output node of the switch circuit with a first reference voltage, to assert a first enable terminal to the first overcurrent detection sub-circuit when the voltage at the output node of the switch circuit is greater than the first reference voltage, and to assert a second enable terminal to the second overcurrent detection sub-circuit when the voltage at the output node of the switch circuit is not greater than the first reference voltage;

wherein the first overcurrent detection sub-circuit is configured to perform overcurrent detection on the switch circuit in response to assertion of the first enable terminal, and to assert the first overcurrent indication terminal in response to detecting overcurrent in the switch circuit; and wherein the second overcurrent detection sub-circuit is configured to perform overcurrent detection on the switch circuit in response to assertion of the second enable terminal, and to assert the second overcurrent indication terminal in response to detecting overcurrent in the switch circuit.

16. The electronic device according to claim 15, wherein the switch circuit comprises:

a first N-channel metal oxide semiconductor (NMOS) switch with a drain coupled to the input node; and a second NMOS switch with a source coupled to a source of the first NMOS switch and a drain coupled to the output node, wherein the second overcurrent detection sub-circuit is configured to compare a voltage at the source of the second NMOS switch with a second reference voltage, and to assert the second overcurrent indication terminal in response to the voltage at the source of the second NMOS switch being greater than the second reference voltage.

17. The electronic device according to claim 16, wherein the second overcurrent detection sub-circuit comprises:

a first comparator defining a first input coupled to the source of the second NMOS switch, a second input, and a first comparison output defining the second overcurrent indication terminal; and a reference voltage generation circuit configured to generate and provide the second reference voltage to the second input.

18. The electronic device according to claim 17, wherein the reference voltage generation circuit comprises:

a reference current source coupled between the input node and the second input; and a resistor circuit coupled between the output node and the second input.

19. The electronic device according to claim 17, wherein the first overcurrent detection sub-circuit comprises:

a second comparator having a first input, a second input, and a first comparison output defining the first overcurrent indication terminal;

the second input of the second comparator coupled to a third reference voltage during periods of time when the first overcurrent indication terminal is de-asserted, and the second input of the second comparator coupled to a fourth reference voltage during periods of time when the first overcurrent indication terminal is asserted, the third reference voltage different than the fourth reference voltage; and a current mirror circuit coupled to the first input of the second comparator, and configured to generate a second current proportional to a first current flowing through the switch circuit and to provide a voltage correlated with the second current to the first input of the second comparator.

* * * * *